United States Patent
Kurata

(10) Patent No.: US 7,215,075 B2
(45) Date of Patent: May 8, 2007

(54) ORGANIC EL DEVICE HAVING UPPER ELECTRODE INCLUDING PLURALITY OF TRANSPARENT ELECTRODE LAYERS AND METHOD FOR MANUFACTURING THE SAME

(75) Inventor: Noboru Kurata, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 340 days.

(21) Appl. No.: 10/837,887

(22) Filed: May 3, 2004

(65) Prior Publication Data

US 2005/0007014 A1    Jan. 13, 2005

(30) Foreign Application Priority Data

May 2, 2003    (JP)    ............... 2003-127474

(51) Int. Cl.
*H05B 33/00* (2006.01)
*H05B 33/26* (2006.01)

(52) U.S. Cl. ............. 313/506; 313/501; 313/504; 428/690; 445/24

(58) Field of Classification Search ........... None
See application file for complete search history.

(56) References Cited

U.S. PATENT DOCUMENTS 6,284,393 B1 * 9/2001 Hosokawa et al. ......... 428/690
6,641,933 B1 * 11/2003 Yamazaki et al. .......... 428/690
7,071,615 B2 * 7/2006 Lu et al. .................... 313/506
2004/0140757 A1 * 7/2004 Tyan et al. ................. 313/504

FOREIGN PATENT DOCUMENTS

| JP | 10-294182 A | 11/1998 |
| JP | 11-48387 A | 2/1999 |
| JP | 11048387 A * | 2/1999 |
| JP | 2000-77191 A | 3/2000 |
| JP | 2000077191 A * | 3/2000 |
| JP | 2001-52878 A | 2/2001 |
| JP | 2002-324662 A | 11/2002 |
| WO | WO 01/57904 A1 * | 8/2001 |

OTHER PUBLICATIONS

Relevant portion of Japanese Office Action of corresponding Japanese Application 2003-127474.

* cited by examiner

*Primary Examiner*—Sikha Roy
(74) *Attorney, Agent, or Firm*—Rossi, Kimms & McDowell LLP

(57) ABSTRACT

A top emission type organic EL device is disclosed that contains, as a cathode, a transparent electrode that has low reflectivity over a broad wavelength region. The organic EL device has at least lower electrodes, an organic EL layer and an upper electrode formed sequentially on a supporting substrate. The upper electrode is formed from a plurality of transparent electrode layers having different refractive indices to one another. Also disclosed is a method of manufacturing such an organic EL device.

9 Claims, 7 Drawing Sheets

ORGANIC EL DEVICE HAVING UPPER ELECTRODE INCLUDING PLURALITY OF TRANSPARENT ELECTRODE LAYERS AND METHOD FOR MANUFACTURING THE SAME

BACKGROUND OF THE INVENTION

The present invention relates to an organic EL device used in a color television, a personal computer, a pachinko machine or the like, and a method of manufacturing the organic EL device. In particular, the present invention relates to a top emission type organic EL device in which the upper electrode has special features, and a method of manufacturing the organic EL device.

Ever since the announcement by C. W. Tang et al. of the Eastman Kodak Company of a high-efficiency organic EL device, which had a two-layer structure, in 1987 (see Tang and Van Slyke, *Appl. Phys. Lett.,* 51, 913 (1987)), various organic EL devices have been developed, and some have been commercialized. In the development of organic EL devices, improving the efficiency of the device is a very important issue from the viewpoint of practical application.

With an organic EL device, light from a light-emitting layer is divided into light that travels directly to the outside, and light that travels to the outside after being reflected. To improve the light emission efficiency, it is necessary to use the reflected waves efficiently. With a so-called 'bottom emission' type organic EL device 100 as shown in FIG. 1, the light is extracted from the side of transparent substrate 102. In such a device aluminum, which has a low work function, is often used as cathode 108. Aluminum has high reflectivity and is thus a very suitable metal, and hence the light from the organic EL layer can be reflected and extracted from the side of transparent substrate 102 efficiently. In FIG. 1, the anode is represented by reference numeral 104, and the organic EL layer is represented by reference numeral 106. FIG. 1 shows a situation in which organic EL layer 106 comprises hole injection layer 110, hole transport layer 112, organic light-emitting layer 114, electron transport layer 116, and electron injection layer 118.

In recent years, development of active matrix type devices for organic EL displays has been pursued vigorously. With a bottom emission type active matrix type organic EL display, a TFT substrate is used, and a light-emitting part including the organic EL layer is formed thereon. However, the current state of the art is that there is much fluctuation in the properties of the TFTs and organic EL layer, and various driving circuitry must be added to correct for this fluctuation. This results in complex circuitry. With more complex circuitry, the number of TFTs required to drive each pixel of the organic EL display increases. This increase in the number of TFTs results in an increase in the proportion of the area of the transparent part of the lower electrode that is occupied by the TFTs, which results in a drop in the area for extraction of light. For this reason, a 'top emission' type in which the light is extracted from the side of the upper electrode, i.e., the opposite side to the substrate, is advantageous compared with the bottom emission type (see Japanese Patent Application Laid-open No. 2001-176660). Such a top emission type organic EL device is shown in FIG. 2. In FIG. 2, the same reference numerals as in FIG. 1 have been used for corresponding elements. Organic EL device 200 of FIG. 2 has reflective film 202, transparent anode 104, organic EL layer 106 comprising a hole injection layer, a hole transport layer, a light-emitting layer, an electron transport layer and an electron injection layer, and transparent cathode 208, on transparent substrate 102. With the top emission type organic EL device, the light is extracted from the side of transparent cathode 208. As shown in FIG. 2, part 204 of the light emitted from the organic EL layer 106 is extracted to the outside from the side of transparent cathode 208 directly, and part 206 of the light is extracted from the side of transparent cathode 208 after having been reflected by reflective film 202.

With such a top emission type organic EL device, because the light is extracted from the side of the cathode, the cathode must be made of an electrode material that has good electrical conductivity and transparency, and also a low work function. Examples of materials having good electrical conductivity and transparency are indium-tin oxide (ITO) and indium-zinc oxide (IZO), but these materials have a high work function. The idea of depositing a thin layer of an alkali metal, alkaline earth metal or rare earth metal having a low work function as an electron injection layer on the electron transport layer has thus been disclosed (see Japanese Patent Application Laid-open No. 2001-52878). In the situation where such a transparent oxide electrode and electron injection layer are adjacent to one another, atomic diffusion occurs at the interface between the two, which leads to an increase in the interface resistance and a resultant drop in the efficiency.

More recently, a cathode comprising an electron injector having a two-layer cathode with a metal layer having a work function of less than 4 eV or a thin inner layer made of a metal fluoride or a metal oxide and an Al outer layer, an electrically conductive semi-transparent metal layer that augments the electrical conductivity of the electron injector, and a transparent layer having a refractive index of at least 1.2, and also a surface light-emitting organic light-emitting diode using the cathode have been reported (see Japanese Patent Application Laid-open No.10-74586). This report discloses a cathode in which a material having high transmissivity is laminated onto an electrically conductive metal film having low transmissivity. With such a cathode, the transmissivity can be improved for only a specific wavelength and wavelength in the vicinity thereof, but the transmissivity drops for other wavelength regions.

As described above, with a top emission type organic EL device in which the upper electrode is made to be a cathode, there is a problem that the efficiency of light extraction from the organic EL layer is low.

SUMMARY OF THE INVENTION

It is therefore an object of the present invention to provide a top emission type organic EL device that contains, as a cathode, a transparent electrode that has low reflectivity over a broad wavelength region.

In accordance with these an other objects of the invention, there is provided a top emission type organic EL device in which the upper electrode is formed from a plurality of transparent electrode layers that have different refractive indices to one another. The organic EL device has at least lower electrodes, an organic EL layer and an upper electrode that are formed sequentially on a supporting substrate. The upper electrode are formed from a plurality of transparent electrode layers having different refractive indices to one another. The organic EL device of the present invention includes a so-called TFT type organic EL device, in which thin film transistors are further provided on the supporting substrate. The lower electrodes are connected to the thin film transistors, and driven by the thin film transistors. Furthermore, the present invention includes a color organic EL device in which a color-converting filter substrate comprising at least a transparent substrate and color-converting filter layers is provided on the upper electrode side. In particular, the organic EL device of the present invention is preferably characterized in that the plurality of transparent electrode layers constituting the upper electrode satisfy the conditions (A) $n_{i-1} > n_i > 1$ when i=2, and both $n_{i+1} > n_i > 1$ and $n_{i-1} > n_i > 1$ when i>2, and (B) (a) $n_i \times d_i = (2y+1) \times \lambda_i/4$, and (b) $n_{i-1} \times d_{i-1} = (2z+1) \times \lambda_i/2$, wherein i is an even number of at least 2, $n_i$ is the refractive index of the $i^{th}$ transparent electrode layer, $n_{i-1}$ is the refractive index of the $(i-1)^{th}$ transparent electrode layer, $n_{i+1}$ is the refractive index of the $(i+1)^{th}$ transparent electrode layer, $d_i$ is the thickness of the $i^{th}$ transparent electrode layer, $d_{i-1}$ is the thickness of the $(i-1)^{th}$ transparent electrode layer, y is an integer of at least 1, z is an integer of at least 1, and $\lambda_i$ is the wavelength of light for which the reflectivity is to be reduced for the $i^{th}$ transparent electrode layer. In the present invention, the material of each of the plurality of transparent electrode layers constituting the upper electrode is preferably an In—Zn oxide or an In—Sn oxide. Furthermore, in the present invention, it is preferable for a reflective film to be provided on the supporting substrate, or for the lower electrodes to be made to be reflective lower electrodes.

The present invention further relates to a method of manufacturing an organic EL device as described above. In the method of manufacturing the organic EL device, at least lower electrodes, an organic EL layer and an upper electrode are formed sequentially on a supporting substrate. The method comprises (1) providing a supporting substrate, (2) forming lower electrodes on the supporting substrate, (3) forming an organic EL layer on the lower electrodes, and (4) forming an upper electrode on the organic EL layer, wherein in the upper electrode of (4) is formed of a plurality of transparent electrode layers having different refractive indices to one another by using a sputtering method, an ion plating method or a vapor deposition method, in which the power and/or the oxygen concentration is adjusted during film formation. The present invention includes a method of manufacturing an organic EL device in which, thin film transistors are first formed on the supporting substrate, and then a flattening layer is formed thereon.

The manufacturing method of the present invention includes a method of manufacturing a color organic EL device, as described above. This method further comprises forming a color-converting filter substrate comprising at least color-converting filter layers after the upper electrode is formed. In the manufacturing method of the present invention, the plurality of transparent electrode layers constituting the upper electrode preferably are formed so as to satisfy the conditions (A) $n_{i-1} > n_i > 1$ when i=2, and both $n_{i+1} > n_i > 1$ and $n_{i-1} > n_i > 1$ when i>2, and (B) (a) $n_i \times d_i = (2y+1) \times \lambda_i/4$, and (b) $n_{i-1} \times d_{i-1} = (2z+1) \times \lambda_i/2$, wherein i is an even number of at least 2, $n_i$ is the refractive index of the $i^{th}$ transparent electrode layer, $n_{i-1}$ is the refractive index of the $(i-1)^{th}$ transparent electrode layer, $n_{i+1}$ is the refractive index of the $(i+1)^{th}$ transparent electrode layer, $d_i$ is the thickness of the $i^{th}$ transparent electrode layer, $d_{i-1}$ is the thickness of the $(i-1)^{th}$ transparent electrode layer, y is an integer of at least 1, z is an integer of at least 1, and $\lambda_i$ is the wavelength of light for which the reflectivity is to be reduced for the $i^{th}$ transparent electrode layer.

Figure 1:
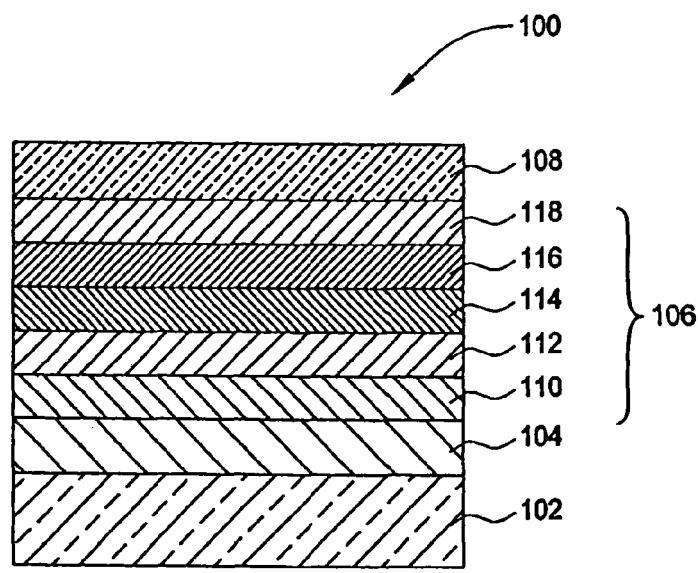
FIG. 1 is a schematic sectional view showing the structure of a conventional bottom emission type organic EL device.
Figure 2:
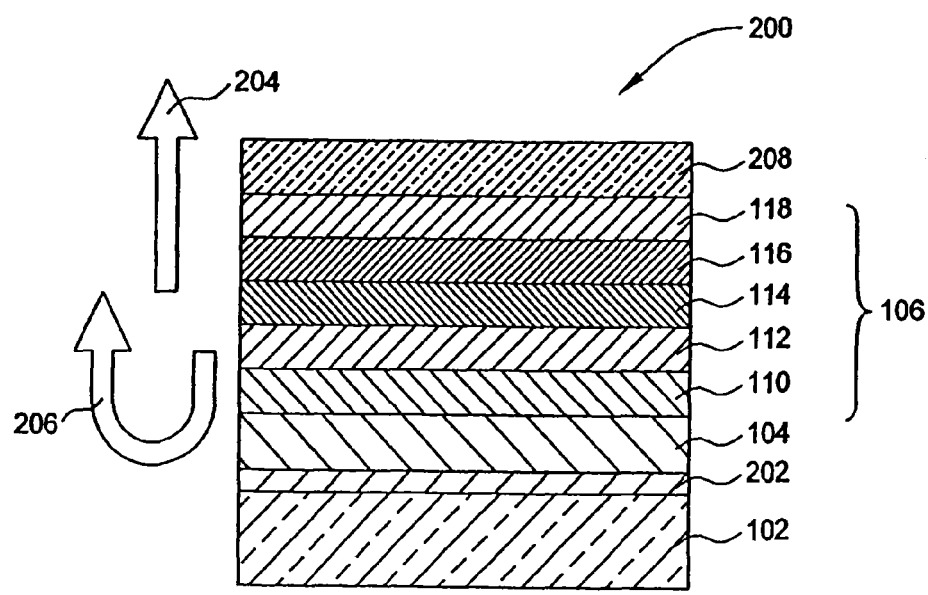
FIG. 2 is a schematic sectional view showing the structure of a conventional top emission type organic EL device

DESCRIPTION OF PREFERRED
EMBODIMENTS

With a top emission type organic EL device in which the upper electrode is made to be a transparent cathode, one cause of a decrease in the efficiency of light extraction is the reflection of light at the transparent cathode on the side of the organic EL device from which the light is extracted. That is, if a material such as IZO or ITO is used as the cathode, then light emitted from the organic EL layer is reflected by the IZO or ITO. This reflectivity is as high as 15% with IZO. In the present invention, there is provided a top emission type organic EL device for which the drop in the efficiency due to such reflection of light at the transparent cathode is suppressed, thereby improving the efficiency of light extraction over a broad wavelength region, with no increase in cost.

A first aspect of the present invention relates to a top emission type organic EL device having the characteristics described above. The organic EL device of the present invention is an organic EL device in which there is a transparent cathode on the side from which the light is extracted. The cathode (upper electrode) is formed from a plurality of transparent electrode layers having different refractive indices to one another.

The present invention will now be described in detail with respect to the case in which the transparent electrode constituting the upper electrode comprises four layers.

Out of the four layers of the upper electrode, the first transparent electrode layer has a refractive index of $n_1$, and a minimum reflectivity at a wavelength of $\lambda_1$.

Next, consider the second transparent electrode layer. When trying to reduce the reflectivity of the second transparent electrode layer, reflection of light from the light-emitting layer is reduced by utilizing the phenomenon of interference of light within the multi-layered transparent cathode (upper electrode). In the case of forming a second transparent electrode layer having a refractive index of $n_2$ on the first transparent electrode layer having a refractive index of $n_1$, the relationship of the following formula (1) is thus obtained between the refractive index of the second transparent electrode layer, the thickness of the second transparent electrode layer, and the wavelength of light for which one wishes to reduce the reflectivity for reflection at the second transparent electrode layer.

$$n_2 \times d_2 = (2y+1) \times \lambda_2 / 4 \quad (1)$$

Here, y is an integer of at least 1, and $d_2$ represents the thickness of the second transparent electrode layer.

Based on this relationship, for the second transparent electrode layer, the wavelength $\lambda_2$ for which one wishes to reduce the reflectivity can be freely set by suitably selecting the refractive index and the thickness.

Moreover, when $n_1 > n_2 > n_0$ (here, $n_0$ represents the refractive index of the medium in which the upper electrode lies), the minimum value of the reflectivity $R_1$ for light emitted from the inside of the second transparent electrode layer is obtained from the following equation.

$$R_1 = \left( \frac{n_0 n_1 - n_2^2}{n_0 n_1 + n_2^2} \right)^2 \quad \text{[Equation 1]}$$

In particular, $R_1 = 0$ in the case that the refractive indices satisfy the following condition.

$$n_2 = \sqrt{n_0 n_1} \quad \text{[Equation 2]}$$

The second transparent electrode layer having the refractive index $n_2$ thus has a minimum reflectivity given by the above reflectivity relationship at any chosen wavelength $\lambda_2$.

Next, consider the case that a third transparent electrode layer having a refractive index of $n_3$ is formed to a thickness of $d_3$ on the second transparent electrode layer. In this case, again reflection of light from the light-emitting layer is reduced by utilizing the phenomenon of interference of light within the multi-layered transparent cathode (upper electrode), and hence trying to reduce the reflectivity of the third transparent electrode layer, the relationship between the refractive index of the third transparent electrode layer, the thickness of the third transparent electrode layer, and the wavelength of light for which one wishes to reduce the reflectivity for reflection at the third transparent electrode layer is given by the following formula (2).

$$n_3 \times d_3 = (2z+1) \times \lambda_3 / 2 \quad (2)$$

Here, z is an integer of at least 1.

Based on this relationship, for the third transparent electrode layer, the wavelength $\lambda_3$ for which one wishes to reduce the reflectivity can be freely set by suitably selecting the refractive index and the thickness.

Moreover, when $n_3 > n_2 > n_0$, the minimum value of the reflectivity $R_2$ for the third transparent electrode layer is obtained from the following equation.

$$R_2 = \left( \frac{n_3 - n_2}{n_3 + n_2} \right)^2 \quad \text{[Equation 3]}$$

The third transparent electrode layer having the refractive index $n_3$ thus has a minimum reflectivity given by the above reflectivity relationship at any chosen wavelength $\lambda_3$.

Furthermore, now consider the case that a fourth transparent electrode layer having a refractive index of $n_4$ is formed to a thickness of $d_4$ on the third transparent electrode layer. In this case, as in the case of the second transparent electrode layer described earlier, when trying to reduce the reflectivity of the fourth transparent electrode layer, the relationship between the refractive index of the fourth transparent electrode layer, the thickness of the fourth transparent electrode layer, and the wavelength of light for which one wishes to reduce the reflectivity for reflection at the fourth transparent electrode layer is given by the following formula (3).

$$n_4 \times d_4 = (2y+1) \times \lambda_4 / 4 \quad (3)$$

Based on this relationship, for the fourth transparent electrode layer, the wavelength $\lambda_4$ for which one wishes to reduce the reflectivity can be freely set by suitably selecting the refractive index and the thickness.

Moreover, when $n_3 > n_4 > n_0$, the minimum value of the reflectivity $R_4$ for the fourth transparent electrode layer is obtained from the following equation.

$$R_4 = \left( \frac{n_2 n_4 - n_3^2}{n_2 n_4 + n_3^2} \right)^2 \quad \text{[Equation 4]}$$

Here, y is an integer of at least 1, and $d_4$ represents the thickness of the fourth transparent electrode layer.

The fourth transparent electrode layer having the refractive index $n_4$ thus has a minimum reflectivity given by the above reflectivity relationship at any chosen wavelength $\lambda_4$.

From the above, by forming the second to fourth transparent electrode layers on the first transparent electrode layer, the various layers can respectively minimize the reflectivity at the wavelengths from $\lambda_1$ to $\lambda_4$, and hence the reflectivity of the upper electrode can be reduced over the wavelength range from $\lambda_1$ to $\lambda_4$.

By forming a plurality of transparent electrode layers that satisfy the conditions described above, the reflectivity can be reduced over any chosen wavelength range.

Based on the above, selection of the refractive indices, thicknesses and wavelengths for the plurality of transparent electrode layers constituting the upper electrode in the present invention satisfies the following conditions, wherein i is an even number of at least 2, $n_i$ is the refractive index of the $i^{th}$ transparent electrode layer, $n_{i-1}$ is the refractive index of the $(i-1)^{th}$ transparent electrode layer, $n_{i+1}$ is the refractive index of the $(i+1)^{th}$ transparent electrode layer, $d_i$ is the thickness of the $i^{th}$ transparent electrode layer, $d_{i-1}$ is the thickness of the $(i-1)^{th}$ transparent electrode layer, y is an integer of at least 1, z is an integer of at least 1, and $\lambda_i$ is the wavelength of light to be transmitted by the $i^{th}$ transparent electrode layer.

(A) $n_{i-1} > n_i > 1$ when i=2, and both $n_{i+1} > n_i > 1$ and $n_{i-1} > n_i > 1$ when i>2, and (B) (a) $n_i \times d_i = (2y+1) \times \lambda_i / 4$, and (b) $n_{i-1} \times d_{i-1} = (2z+1) \times \lambda_i / 2$ Following is a description of the organic EL device and manufacturing method thereof according to the present invention. In the following description, the drawings are referred to as appropriate; however, the organic EL devices and manufacturing methods shown in the drawings are merely examples, and the present invention is not limited thereto.

First, the organic EL device of the present invention will be described with reference to FIGS. 3 and 4. FIG. 3 shows schematic sectional views of a first embodiment (passive type) of the organic EL device of the present invention. FIG. 4 shows schematic sectional views of a second embodiment (TFT type) of the organic EL device of the present invention.

Figure 3A:
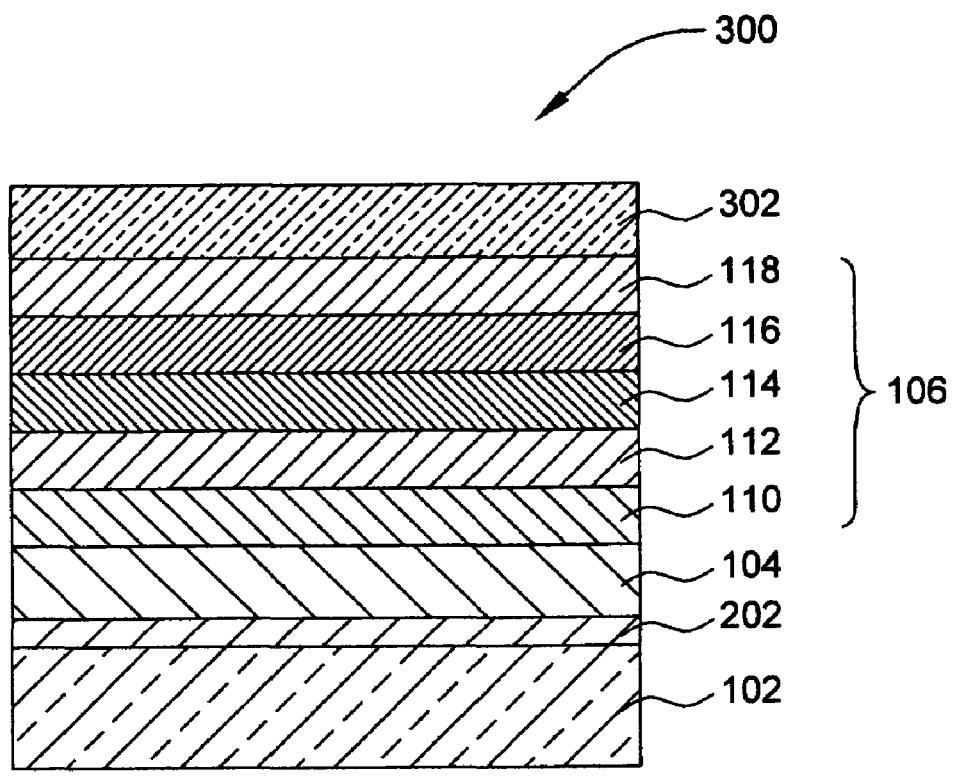
FIG. 3(a) is a schematic view showing the structure of a top emission type passive type organic EL device of the present invention.

The first embodiment of the organic EL device of the present invention is a so-called top emission type passive type matrix organic EL device 300 as shown in FIG. 3(a). The top emission type is one in which the light is extracted from the side of upper electrodes 302. As shown in FIG. 3(a), organic EL device 300 of this embodiment comprises supporting substrate 102, and provided thereon reflective film 202, lower electrodes 104, organic EL layer 106, and upper electrodes 302 sequentially. When organic EL device 300 is used as a display, the organic EL device will have a plurality of pixels. In the case of carrying out driving for the plurality of pixels using the passive matrix method, the lower electrodes and the upper electrodes can each be formed in a line pattern, with the lines of the lower electrodes and the lines of the upper electrodes running in orthogonal directions.

Figure 3B:
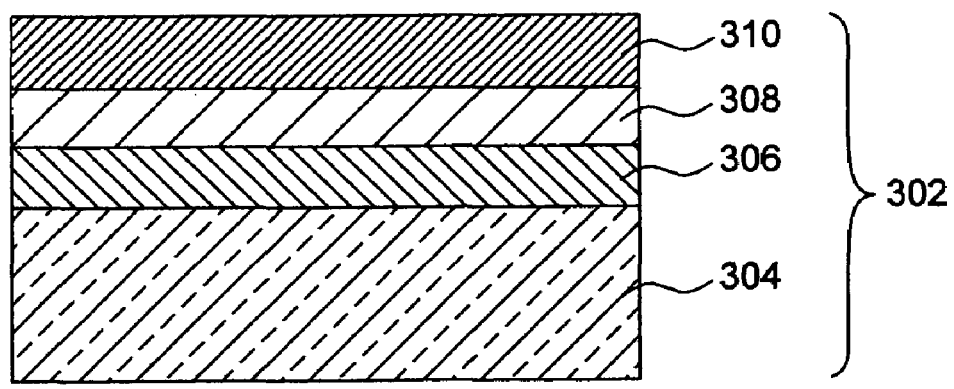
FIG. 3(b) is a schematic sectional view showing the structure of the upper electrode.

With organic EL device 300 of the present embodiment, as shown in FIG. 3(b), upper electrodes 302 are formed from a plurality of transparent electrode layers 304, 306, 308 and 310. The plurality of transparent electrode layers are formed so as to satisfy conditions (A) and (B) described earlier. By forming the transparent electrode layers in this way, the reflectivity of the upper electrodes can be reduced over a desired wavelength region as described earlier.

Note that in the present invention an insulating film (not shown in the drawings) may be provided as desired on the lower electrodes. In order to maintain the gas-tightness of the organic EL device in the present invention it is preferable to provide a passivation layer (not shown in the drawings) over the upper electrodes and the organic EL layer. In addition, the organic EL device of the present invention can be sealed using a sealing substrate (transparent substrate), an outer periphery sealing layer and a filler layer.

Note that in FIG. 3(b), an upper electrode comprising four layers was shown as an example, but the present invention is not limited thereto. It being possible to form any number of transparent electrode layers such that the reflectivity can be reduced over the desired wavelength range.

Next, a description will be given of the organic EL device of the second embodiment of the present invention.

Figure 4A:
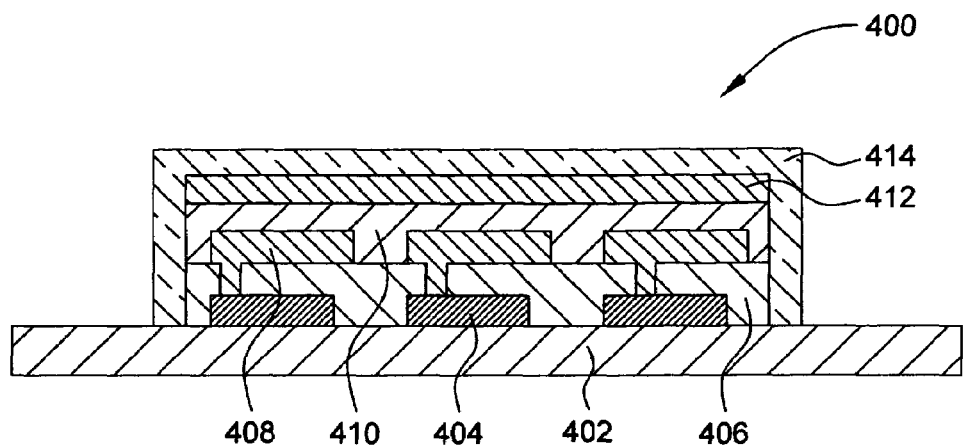
FIG. 4(a) is a schematic view showing the structure of a top emission type TFT type organic EL device of the present invention.

The organic EL device of the second embodiment of the present invention is a so-called top emission type TFT type organic EL device 400 as shown in FIG. 4(a). This organic EL device is again of a type in which the light is extracted from the side of upper electrode 412.

As shown in FIG. 4(a), the organic EL device of this embodiment has an organic EL light-emitting device which comprises substrate 402, and provided thereon TFTs 404, flattening layer 406, lower electrodes 408, organic EL layer 410, upper electrode 412, and passivation layer 414 sequentially.

In order to maintain the gas-tightness of the organic EL device in the present embodiment, it is preferable to provide passivation layer 414 over the upper electrode and the organic EL layer. Moreover, the organic EL device of the present embodiment can again be sealed using a sealing substrate (transparent substrate), an outer periphery sealing layer and a filler layer.

When organic EL device 400 is used as a display, as shown in FIG. 4(a), a plurality of thin film transistors (the TFTs) and patterned lower electrodes should be provided in correspondence with the plurality of pixels.

Figure 4B:
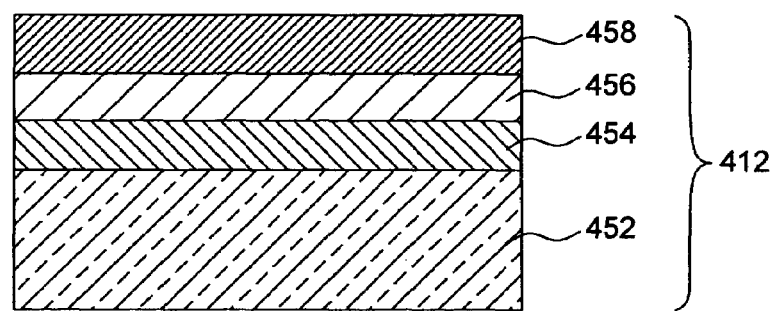
FIG. 4(b) is a schematic sectional view showing the structure of the upper electrode.

With organic EL device 400 of the present invention, as shown in FIG. 4(b), the upper electrode 412 is formed from a plurality of transparent electrode layers 452, 454, 456, and 458. The plurality of transparent electrode layers are formed so as to satisfy conditions (A) and (B) described earlier. By forming the transparent electrode layers in this way, the reflectivity of the upper electrode can be reduced over a desired wavelength region as described earlier.

Following is a description of the various elements of an organic EL device of the present invention. Note that in the following, optional elements not shown in FIG. 3 or 4 are also described.

(i) Lower Electrodes, Organic EL Layer, and Upper Electrode(s)

The organic EL device of the present invention has a structure in which at least an organic light-emitting layer is disposed between two sets of electrodes, and if necessary a hole injection layer, an electron injection layer and so on may be interposed. That is, the organic EL device of the present invention comprises at least lower electrodes, an organic EL layer comprising, for example, a hole injection layer, an organic light-emitting layer and an electron transport layer, and upper electrode(s). Specifically, the organic EL device has a structure such as the following.

(1) Anode(s)/organic light-emitting layer/cathode(s)
(2) Anode(s)/hole injection layer/organic light-emitting layer/cathode(s)
(3) Anode(s)/organic light-emitting layer/electron transport layer/cathode(s)
(4) Anode(s)/hole injection layer/organic light-emitting layer/electron transport layer/cathode(s)
(5) Anode(s)/hole injection layer/hole transport layer/organic light-emitting layer/electron transport layer/cathode(s)
(6) Anode(s)/hole injection layer/hole transport layer/organic light-emitting layer/electron transport layer/electron injection layer/cathode(s)

In the above layer structures, it is preferable for at least one of the anode(s) and the cathode(s) to be transparent in the wavelength region of the light emitted by the organic EL layer. The light is emitted via this/these transparent electrode(s).

Moreover, in the present specification, the part comprising the organic layers (organic light-emitting layer, hole injection layer, hole transport layer, electron transport layer, and/or electron injection layer) sandwiched between the lower electrodes and the upper electrode(s) is referred to as the "organic EL layer." Moreover, in the present specification, the lower electrodes, the organic EL layer, and the upper electrode(s) are collectively referred to as the "light-emitting part."

In the present invention, the lower electrodes and upper electrode(s) used are as follows.

(a) Lower Electrodes (104 or 408)

The lower electrodes 104 are formed on the supporting substrate 102. The lower electrodes 104 are electrodes that are able to inject electrons or holes efficiently into the organic light-emitting layer. The lower electrodes can be used as anodes or cathodes, but in the present invention are preferably used as anodes.

In the case of using the lower electrodes as anodes, a material having a high work function is used so that the injection of holes can be carried out efficiently. With the organic EL device of the present invention, which is a top emission type, the lower electrodes do not have to be transparent, and can be formed using an electrically conductive metal oxide such as ITO or IZO. Furthermore, in the case of using an electrically conductive metal oxide such as ITO, it is preferable to use an electrode of a metal having a high reflectivity (Al, Ag, Mo, W etc.) beneath it. This metal electrode has lower resistivity than the electrically conductive metal oxide and thus functions as an auxiliary electrode, and moreover reflects light emitted from the organic EL layer back toward the upper electrode side, enabling the light to be utilized effectively. Moreover, the lower electrodes can be made to be lower electrodes having a reflecting function. Specifically, instead of IZO or the like, a reflective metal such as Ni or Cr, which has high reflectivity, may be subjected to UV treatment, thus making the work function similar to that of IZO or the like. As a result, the prescribed reflective metal becomes able to inject holes, and hence can be used as the anodes.

When using the lower electrodes as cathodes, with the top emission method, a material having a low work function, i.e., an electron-injecting metal selected from alkali metals such as lithium, sodium and potassium, and alkaline earth metals such as calcium, magnesium and strontium, or a fluoride or the like thereof, or an alloy thereof with other metals or a compound thereof can be used. As before, electrodes of a metal having a high reflectivity (Al, Ag, Mo, W etc.) may be used beneath this. In this case, the resistance can be reduced, and the light emitted by the organic light-emitting layer can be utilized effectively through reflection.

(b) Upper Electrode(s) (302 or 412)

The upper electrode(s) is/are electrode(s) that is/are able to inject electrons or holes efficiently into the organic light-emitting layer.

In the case of the organic EL device of the present invention, which is a top emission type, the upper electrode(s) is/are required to be transparent in the emission wavelength region of the organic light-emitting layer. For example, the upper electrode(s) preferably has/have a transmissivity of at least about 50%, more preferably at least about 90%, to light of wavelength 400 to 800 nm.

The upper electrode(s) of the present invention is/are constituted such that the reflectivity to light over a prescribed wavelength range is reduced, whereby the light can be extracted efficiently.

When using the upper electrode(s) as cathode(s) in a top emission type organic EL device, the upper electrode(s) must be transparent in the wavelength region of the light emitted by the organic light-emitting layer. In this case, it is thus preferable to use a transparent electrically conductive material such as ITO or IZO. Moreover, the material of the upper electrode(s) is required to have a low work function so that electrons can be injected efficiently. To satisfy both of these characteristics in the present invention, i.e., low work function and transparency, the upper electrode(s) may comprise a plurality of layers comprising transparent electrode layers and a layer made of a material having a low work function (which corresponds to the electron injection layer in the organic EL layer). In general, materials having a low work function have low transparency, and hence doing the above is effective. For example, an ultra-thin film (thickness not more than 10 nm) of a material such as an electron-injecting metal selected from alkali metals such as lithium, sodium and potassium, and alkaline earth metals such as calcium, magnesium and strontium, or a fluoride or the like thereof, or an alloy thereof with other metals or a compound thereof can be used. Moreover, a material such as Al or Mg/Ag can also be used.

By using such a material having a low work function, efficient electron injection becomes possible. In addition, by making the film ultra-thin, the reduction in the transparency caused by this material can be minimized. Transparent electrode layers made of ITO, IZO or the like are formed on this ultra-thin film. The ultra-thin film functions as an auxiliary electrode, reducing the resistance of the upper electrode(s) as a whole, and hence enabling a sufficient current to be supplied to the organic light-emitting layer.

In the case of using the upper electrode(s) as anode(s), a material having a high work function must be used to increase the efficiency of hole injection. In the case that the organic EL device is of the top emission type, the light emitted from the organic light-emitting layer will pass through the upper electrode, and hence a material having high transparency must be used. In this case, it is preferable to use a transparent electrically conductive material such as ITO or IZO.

In the present invention, when the upper electrode(s) is/are used as anode(s), the upper electrode(s) is/are formed from a plurality of transparent electrode layers, and in the case that the upper electrode(s) is/are used as cathode(s), the upper electrode(s) is/are formed from a plurality of transparent electrode layers formed on an ultra-thin film having a low work function. Regarding the plurality of transparent electrode layers, taking $n_i$ to be the refractive index of the $i^{th}$ transparent electrode layer, $n_{i-1}$ to be the refractive index of the $(i-1)^{th}$ transparent electrode layer, $n_{i+1}$ to be the refractive index of the $(i+1)^{th}$ transparent electrode layer, $d_i$ to be the thickness of the $i^{th}$ transparent electrode layer, and $d_{i-1}$ to be the thickness of the $(i-1)^{th}$ transparent electrode layer, wherein i is an even number of at least 2, the refractive indices, thicknesses and wavelengths are selected so as to satisfy the following conditions.

(A) $n_{i-1} > n_i > 1$ when i=2, and both $n_{i+1} > n_i > 1$ and $n_{i-1} > n_i 1$ when i>2, and (B) (a) $n_i \times d_i = (2y+1) \times \lambda_i / 4$, and (b) $n_{i-1} \times d_{i-1} = (2z+1) \times \lambda_i / 2$.

Here, y is an integer of at least 1, z is an integer of at least 1, and $\lambda_i$ is the wavelength of light to be transmitted by the $i^{th}$ transparent electrode layer.

In the present invention, it is preferable to use transparent electrically conductive films made of ITO, IZO or the like, and to provide a plurality of transparent electrode layers so as to satisfy the above conditions. By forming a plurality of transparent electrode layers in order so as to satisfy such conditions, the reflectivity can be reduced over any chosen wavelength range.

(c) Organic EL Layer (106 or 410)

Commercially-available materials can be used as the materials of the various layers constituting the organic EL layer. To obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used in the organic light-emitting layer. As an electron injection layer, a material having a low work function as described above in the section on the upper electrode(s) can be used. Moreover, as an electron transport layer, a metal complex type compound (Alq3), an oxadiazole type compound, a triazole type compound, or the like can be used. Moreover, as a hole injection layer, an aromatic amine compound, a starburst type amine, a multimer of a benzidine type amine, copper phthalocyanine (CuPc), or the like can be used. As a hole transport layer, a starburst type amine, an aromatic diamine or the like can be used.

The thicknesses of the lower electrodes and the various layers constituting the organic EL layer are the same as used conventionally.

(ii) Reflective Film (202)

In the present invention, out of the light emitted from the light-emitting part, the light traveling toward the lower electrodes is reflected efficiently back toward the upper electrode(s) by providing a reflective film. There are no particular limitations on reflective films that can be used in the present invention, with it being sufficient if the reflective film can efficiently reflect light from the organic EL layer back toward the upper electrode(s). For example, a reflective film made of a metal or alloy that reflects light can be used. The reflective film provided on the transparent substrate will also act as a foundation layer for the organic EL layer, and hence is preferably made to be an amorphous film having excellent flatness. Examples of metals and alloys suitable for forming such an amorphous film include CrB, CrP and NiP.

The reflective film can be provided on the upper surface or the rear surface of the transparent substrate, which is made of glass, plastic or the like. Moreover, a reflective film patterned to match the shape of the lower electrodes may be formed on the transparent substrate. Furthermore, the substrate and the reflective film may be combined by using, instead of a transparent substrate, a substrate made of a metal or an alloy that reflects light, in which case an insulating layer is provided on the substrate. Parameters such as the thickness of the reflective film are as conventionally, and can be selected as appropriate by a person skilled in the art. Note that in the case of using an electrically conductive metal as the reflective film, a thin insulating film is formed on the reflective film. As the material of the thin insulating film, an inorganic oxide, an inorganic nitride, an organic material or the like can be used as described later for the passivation layer and the overcoat layer.

(iii) TFTs (404)

TFTs are provided in the case of carrying out active matrix driving. The TFTs are arranged in a matrix shape on substrate 402, and the source electrodes or drain electrodes are connected to lower electrodes 408 in correspondence with the pixels. Preferably, the TFTs are of a bottom gate type in which the gate electrode is provided below a gate insulating film, and have a structure in which a polycrystalline silicon film is used as the active layer.

The wiring parts for the drain electrodes and gate electrodes of the TFTs, and the TFTs themselves, can be manufactured using a method known in the technical field in question so as to achieve the desired pressure resistance, off current characteristics, and on current characteristics. Moreover, with an organic EL display of the present invention that is of the top emission type, the light does not pass through the TFT parts, and hence it is not necessary to make the TFTs small to increase the aperture ratio; the amount of freedom in the design of the TFTs can thus be increased, which is advantageous for achieving the above-mentioned characteristics.

(iv) Flattening Layer (406)

When using active matrix driving, it is preferable to form a flattening layer over TFTs 404. The flattening layer is provided in parts other than parts required for connection between the source electrodes or drain electrodes of TFTs 404 and lower electrodes 408 and connection of other circuitry, and makes the surface of the substrate flat. This makes it easy to form subsequent layers in a highly detailed pattern. The flattening layer can be formed from any chosen material known in the technical field in question. The flattening layer is preferably formed from an inorganic oxide or nitride, or a polyimide or acrylic resin.

(v) Supporting Substrate (102 or 402)

An insulating substrate made of glass, plastic or the like, or a substrate obtained by forming a thin insulating film on a semi-conductive or conductive substrate, can be used as supporting substrate 102. Alternatively, a flexible film made from a polyolefin, an acrylic resin, a polyester resin, a polyimide resin or the like may be used as supporting substrate 102.

In the present invention, in the case of a top emission type organic EL device, supporting substrate 102 may be constituted from at least a substrate and a reflective film as described earlier. In this case, a material as described above can be used as is for the substrate. Moreover, instead of a supporting substrate, a substrate made of a metal or an alloy that reflects light can be used, in which case an insulating layer is provided on the substrate. As the material of the insulating layer, an inorganic oxide, an inorganic nitride, an organic material or the like can be used as described later for the passivation layer and earlier for the flattening layer.

Parameters such as the thickness of the supporting substrate are as conventionally, and can be selected as appropriate by a person skilled in the art.

(vi) Passivation Layer (414)

With the organic EL device of the present invention, it is preferable to provide a passivation layer (not shown in FIG. 3; reference numeral 414 in FIG. 4) that covers the various layers from the upper electrode down. The passivation layer is effective in preventing penetration of oxygen, low-molecular-weight components and moisture from the outside environment, and thus preventing a deterioration in the functioning of the organic EL layer caused thereby. The passivation layer can be provided as desired, but is preferably provided for the above purpose. The passivation layer will transmit light emitted from the organic EL layer to the outside, and hence is preferably transparent in the emission wavelength region.

To satisfy these requirements, the passivation layer is formed from a material that has high transparency in the visible region (a transmissivity of at least about 50% in a range of 400 to 800 nm), is electrically insulating, acts as a barrier against moisture, oxygen and low-molecular-weight components, and preferably has a film hardness of at least pencil hardness 2 H. For example, a material such as an inorganic oxide or inorganic nitride such as $SiO_x$, $SiN_x$, $SiN_xO_y$, $AlO_x$, $TiO_x$, $TaO_x$ or $ZnO_x$, can be used.

Moreover, any of various polymer materials can be used as the passivation layer. Examples are light-curing resins and/or heat-curing resins such as imide-modified silicone resins (Japanese Patent Application Laid-open Nos. 5-134112, 7-218717, and 7-306311), materials obtained by dispersing an inorganic metal oxide (TiO, $Al_2O_3$, $SiO_2$ etc.) in an acrylic, polyimide or silicone resin or the like (Japanese Patent Application Laid-open Nos. 5-119306 and 7-104114), acrylate monomer/oligomer/polymer resins having reactive vinyl groups, resist resins (Japanese Patent Application Laid-open Nos. 6-300910, 7-128519, 8-279394, and 9-330793), fluororesins (Japanese Patent Application Laid-open Nos. 5-36475 and 9-330793), and epoxy resins having a mesogenic structure having a high thermal conductivity.

The passivation layer may be a single layer, or may be a laminate of a plurality of layers. The thickness of the passivation layer (the total thickness in the case that the passivation layer is a laminate of a plurality of layers) is preferably about 0.1 to 10 μm.

(vii) Insulating Film

With the organic EL device of the present invention, an insulating film (not shown in the drawings) may be provided in parts where no lower electrode is provided on the supporting substrate. The material of the insulating film should be one that has sufficient insulating resistance against the driving voltage for the light-emitting part, and does not have an adverse effect on the light-emitting part. For example, it is preferable to use an inorganic oxide film or an inorganic nitride film. Examples of such an inorganic oxide or inorganic nitride include, for example, silicon oxide, titanium oxide, tantalum oxide, and aluminum nitride.

Parameters such as the thickness of the insulating film are as conventionally, and can be selected as appropriate by a person skilled in the art. For example, the thickness is about 200 to 400 nm, preferably about 250 to 350 nm.

In the case of a passive type matrix, barrier walls of upper electrodes having a height of 1 to 10 μm and overhangs having a length of 1 μm per side additionally are provided between each upper electrode. For example, an inorganic oxide, an inorganic nitride and a photopolymer may be used as the material of the barrier walls of the upper electrodes.

Next, a description will be given of an outer periphery sealing layer (not shown in the drawings), a sealing substrate (not shown in the drawings), and a filler layer (not shown in the drawings). These can be provided as required to maintain the gas-tightness of the organic EL device of the present invention.

(viii) Outer Periphery Sealing Layer

The outer periphery sealing layer has a function of bonding the supporting substrate having the lower electrodes, the insulating film, the organic EL layer and the upper electrode(s) provided thereon to a sealing substrate, and protecting the various constituent elements inside the organic EL device from oxygen, moisture and so on in the outside environment. The outer periphery sealing layer can be formed, for example, from a UV-curing resin.

Once the alignment of the sealing substrate and the supporting substrate has been completed, irradiation with ultraviolet radiation is carried out, thus curing the UV-curing resin.

Moreover, it is preferable for the UV-curing resin used in the outer periphery sealing layer to contain glass beads, silica beads or the like of diameter about 5 to 50 μm, preferably about 5 to 20 μm. This is because during the bonding between the sealing substrate and the supporting substrate. These beads stipulate the inter-substrate distance (the distance between the supporting substrate and the sealing substrate), and moreover bear the pressure that is applied for carrying out the adhesion.

Note that when a filler is to be inserted into the internal space, a hole should be provided in part of the outer periphery sealing layer. After the outer periphery sealing layer has been cured, the filler is filled in from this hole, and then the hole is blocked up.

(ix) Sealing Substrate

There are no particular limitations on the sealing substrate, so long as it is one that will seal up the organic EL device of the present invention and not allow moisture and harmful gases to penetrate in from the outside. Moreover, the thickness and so on are as conventionally. For example, the same material as that of the transparent substrate of the color-converting filter substrate described later, or a conventional sealing substrate can be used as is.

(x) Filler Layer

The filler layer is for filling the internal space formed by the outer periphery sealing layer, the sealing substrate, the light-emitting part and the supporting substrate 102, thus improving the gas-tightness of the organic EL device.

The filler for forming the filler layer should be an inactive liquid or inactive gel that will not have an adverse effect on the properties of the light-emitting part, the color-converting filter layers and so on. Moreover, the filler may be a liquid that gels after having been injected into the internal space. Examples of types of fillers that can be used in the present invention include silicone resins, fluorinated inactive liquids, and fluorinated oils. The amount required of the filler is something that can easily be determined by a person skilled in the art.

In the present invention, the sealing substrate, the outer periphery sealing layer and the filler layer may be formed integrally as a single body by, for example, uniformly applying a resin such as a UV-curing resin or a joint-light/heat-curable resin onto the supporting substrate on which the light-emitting part has been provided, and then curing this resin.

Next, a description will be given of a color organic EL device according to the present invention, with reference to the drawings.

FIG. 5 are schematic sectional views of a color organic EL device (first embodiment) in which a color-converting filter substrate is further provided on the organic EL device of FIG. 3 described earlier. Furthermore, FIG. 6 shows schematic sectional views of a color organic EL device (second embodiment) in which a color-converting filter substrate is further provided on the organic EL device of FIG. 4 described earlier.

Figure 5A:
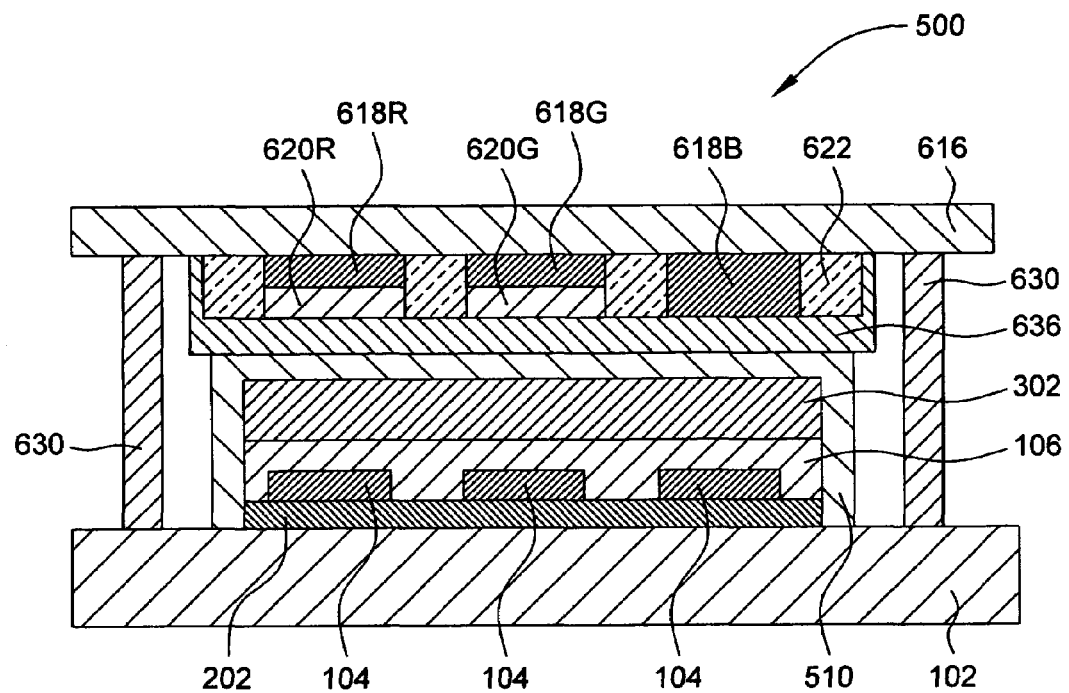
FIG. 5(a) is a schematic view showing the structure of a top emission type passive type color organic EL device of the present invention.
Figure 5B:
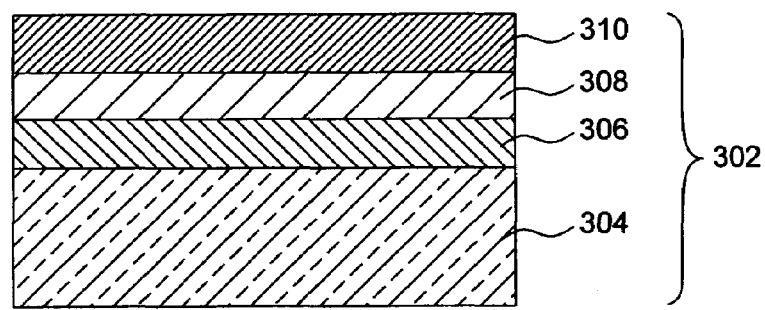
FIG. 5(b) is a schematic sectional view showing the structure of the upper electrode.

Color organic EL device 500 of the first embodiment of the present invention is shown in FIG. 5. FIG. 5(a) shows part of the color organic EL device corresponding to one pixel having red, green and blue parts. Supporting substrate 102, reflective film 202, lower electrodes 104, organic EL layer 106, and upper electrodes 302 shown in FIG. 5(a) are the same as described earlier with regard to FIG. 3. For example, the lower electrodes and the upper electrodes can each be formed in a line pattern, with the lines of the lower electrodes and the lines of the upper electrodes running in orthogonal directions. Moreover, the upper electrodes have the same constitution as that shown in FIG. 3. Specifically, with color organic EL device 500 of the present embodiment, as shown in FIG. 5(b), upper electrodes 302 are formed from a plurality of transparent electrode layers 304, 306, 308 and 310. The plurality of transparent electrode layers are formed so as to satisfy conditions (A) and (B) described earlier. By forming the transparent electrode layers in this way, the reflectivity of the upper electrodes can be reduced over a desired wavelength region as described earlier.

With the color organic EL device of the present embodiment, a color-converting filter substrate comprising at least a transparent substrate and color-converting filter layers is provided on the upper electrode side. Note that in the first embodiment, it is preferable to provide passivation layer 510 on the upper electrode side so as to cover reflective film 202 and the light-emitting part. Moreover, as shown in FIG. 5, the color-converting filter substrate may comprise color-converting filter layers (e.g., blue filter layers 618B, green color-converting filter layers comprising green filter layers 618G and green fluorescent color-converting layers 620G, and red color-converting filter layers comprising red filter layers 618R and red fluorescent color-converting layers 620R), a black matrix 622, an overcoat layer 636 and so on, on transparent substrate 616. Note that a material as described earlier in the section "(vi) Passivation layer (414)" can be used for the overcoat layer. Moreover, as shown in FIG. 5(a), the color-converting filter substrate is bonded on such that the color-converting filter layer side faces the upper electrode side of the organic EL device. When carrying out the bonding, an outer periphery sealing layer as described earlier (reference numeral 630 in FIG. 5(a)) can be used together with a filler layer (the material thereof and so on are as described earlier) or the like.

Moreover, the passive type color organic EL device shown in FIG. 5 includes not only one having a structure in which the color-converting filter substrate is bonded on as described above, but also one in which the color-converting filter layers, the black matrix and so on are provided directly on passivation layer 510.

Next, the second embodiment of the color organic EL device of the present invention will be described with reference to FIG. 6.

Figure 6A:
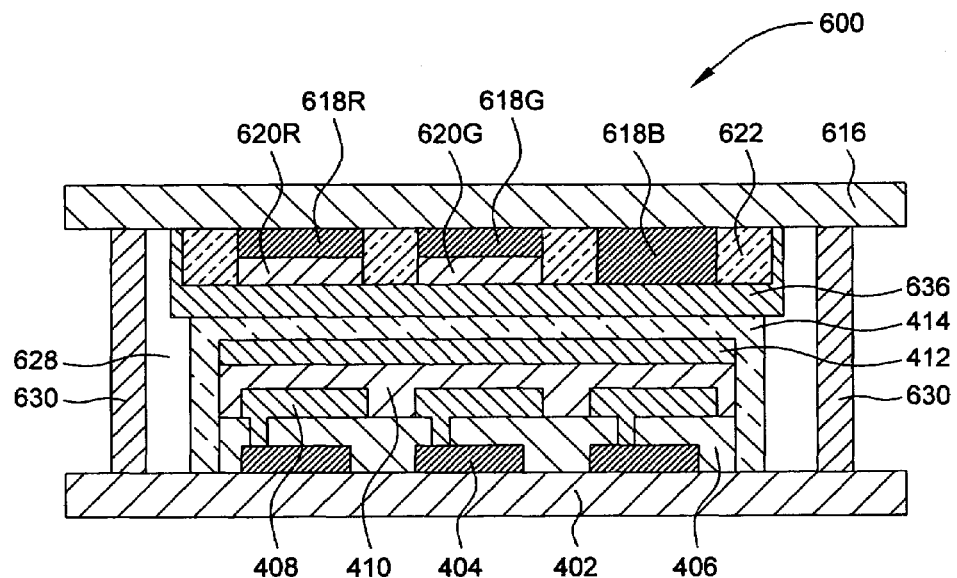
FIG. 6(a) is a schematic view showing the structure of a top emission type TFT type color organic EL device of the present invention.
Figure 6B:
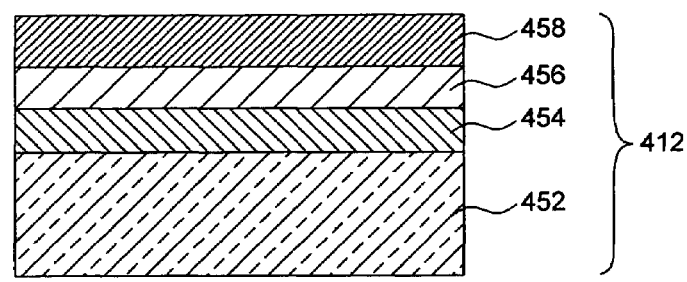
FIG. 6(b) is a schematic sectional view showing the structure of the upper electrode.

FIG. 6(a) shows part of color organic EL device 600 corresponding to one pixel having red, green and blue parts. Supporting substrate 402, TFTs 404, flattening layer 406, lower electrodes 408, organic EL layer 410, upper electrode 412, and passivation layer 414 shown in FIG. 6(a) are the same as described earlier with regard to FIG. 4. In particular, the upper electrode has the same constitution as that shown in FIG. 4. Specifically, with color organic EL device 600 of the present embodiment, as shown in FIG. 6(b), upper electrode 412 is formed from a plurality of transparent electrode layers 452, 454, 456, and 458. The plurality of transparent electrode layers are formed so as to satisfy conditions (A) and (B) described earlier. By forming the transparent electrode layers in this way, the reflectivity of the upper electrode can be reduced over a desired wavelength region as described earlier.

With the color organic EL device of the present embodiment, a color-converting filter substrate comprising at least a transparent substrate and color-converting filter layers is provided on the upper electrode side. As shown in FIG. 6, the color-converting filter substrate may comprise color-converting filter layers (e.g., blue filter layers 618B, green color-converting filter layers comprising green filter layers 618G and green fluorescent color-converting layers 620G, and red color-converting filter layers comprising red filter layers 618R and red fluorescent color-converting layers 620R), black matrix 622, overcoat layer 636 and so on, on transparent substrate 616. As shown in FIG. 6(a), the color-converting filter substrate is bonded so that the color-converting filter layer side faces the upper electrode side of the organic EL device. When carrying out the bonding, an outer periphery sealing layer as described earlier (reference numeral 630 in FIG. 6(a)) can be used together with a filler layer (the material thereof and so on are as described earlier) or the like.

Moreover, the TFT type color organic EL device shown in FIG. 6 includes not only one having a structure in which the color-converting filter substrate is bonded on as described above, but also one in which the color-converting filter layers, the black matrix and so on are provided directly on passivation layer 414.

The color-converting filter substrate in the color organic EL devices of the present invention will now be described. The color-converting filter layers of the color-converting filter substrate are red color-converting filter layers, green color-converting filter layers and blue color-converting filter layers that contain respectively red, green and blue dyes or pigments.

Following is a description of the various elements of the color-converting filter substrate in the present invention.

1. Blue Color-converting Filter Layers

In the present specification, "color-converting filter layer" is a generic term encompassing a color filter layer, a fluorescent color-converting layer, or a laminate of a color filter layer and a fluorescent color-converting layer. A fluorescent color-converting layer is a layer that absorbs light in the near ultraviolet region or visible region, in particular light in the blue or blue/green region, emitted from the organic EL layer, and emits visible light of a different wavelength as fluorescence. To enable full-color display, independent color-converting filter layers that emit light in at least the green (G) region and the red (R) region are provided. The red and green fluorescent color-converting layers each comprise at least an organic fluorescent colorant and a matrix resin.

In the present invention, as the organic fluorescent colorant(s), at least one or more fluorescent colorant(s)that emit(s) fluorescence in the red region is/are used, and it is preferable to combine this/these with one or more fluorescent colorant(s) that emit(s) fluorescence in the green region. The reason for this is as follows. In the case that an organic EL layer is used as the light source, it is easy to obtain an organic EL layer that emits light in the blue or blue/green region, but if one attempts to convert this light into light in the red region merely by passing the light through a red filter, then due to there originally being little light of wavelengths in the red region, the output light will be extremely dim. To obtain light in the red region of sufficient output intensity, it is thus necessary to absorb the light from the organic EL layer (light emitter) and convert this light into light in the red region using fluorescent colorant(s). By converting the light from the light emitter into light in the red region using fluorescent colorant(s) in this way, output of sufficient intensity is possible.

Moreover, regarding light in the green region, similarly to the light in the red region, the light from the light emitter may be converted into light in the green region using other fluorescent colorant(s) and then outputted; alternatively, if the light emitted by the light emitter contains sufficient light in the green region, then the light from the light emitter may be merely passed through a green filter and then outputted.

Furthermore, regarding light in the blue region, the light from the light emitter (organic EL layer) can be merely passed through a blue filter and then outputted.

(1) Organic Fluorescent Colorants

In the present invention, there are no particular limitations on the organic fluorescent colorant(s), so long as it is/they are colorant(s) that absorb light in the near ultraviolet region or visible region, in particular light in the blue or blue/green region, emitted from a light emitter such as an organic EL layer, and emit visible light of a different wavelength to the light emitter.

Examples of fluorescent colorants that absorb light from the blue to blue/green region emitted from the organic EL layer and emit fluorescence in the red region include organic fluorescent colorants such as the following: rhodamine type colorants such as Rhodamine B, Rhodamine 6G, Rhodamine 3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]pyridinium perchlorate (Pyridine 1), and oxazine type colorants. Furthermore, various dyes (direct dyes, acid dyes, basic dyes, disperse dyes, etc.) can also be used if able to emit the desired fluorescence.

Examples of fluorescent colorants that absorb light in the blue to blue/green region emitted from the organic EL layer and emit fluorescence in the green region include organic fluorescent colorants such as the following: coumarin type colorants such as 3-(2-benzothiazolyl)-7-diethylaminocoumarin (Coumarin 6), 3-(2'-benzoimidazolyl)-7-N,N-diethylaminocoumarin (Coumarin 7), 3-(2'-N-methylbenzoimidazolyl)-7-N,N-diethylaminocoumarin (Coumarin 30) and 2,3,5,6-1H,4H-tetrahydro-8-trifluoromethylquinolizino-(9,9a,1-gh)coumarin (Coumarin 153), and Basic Yellow 51, which is a coumarin colorant type dye, and also naphthalimide type colorants such as Solvent Yellow 11 and Solvent Yellow 116, and so on. Furthermore, various dyes (direct dyes, acid dyes, basic dyes, disperse dyes, etc.) can also be used if able to emit the desired fluorescence.

Note that organic fluorescent colorant(s) used in the present invention may be kneaded in advance with a polymethacrylic acid ester, polyvinyl chloride, a vinyl chloride-vinyl acetate copolymer resin, an alkyd resin, an aromatic sulfonamide resin, a urea resin, a melamine resin, a benzoguanamine resin, a mixture of such resins, or the like, to form an organic fluorescent pigment. Moreover, the above organic fluorescent colorants and organic fluorescent pigments (in the present specification, the two are grouped together and referred to generically as "organic fluorescent colorants") may be used singly, or two or more may be used in combination to adjust the color tone of the fluorescence. The organic fluorescent colorant(s) used in the present invention is/are contained in the color-converting filter layers in an amount of about 0.01 to 5 wt %, more preferably about 0.1 to 2 wt %, relative to the weight of the color-converting filter layer. If the organic fluorescent colorant content is less than about 0.01 wt %, then it will not be possible to carry out sufficient wavelength conversion, whereas if this content exceeds 5 wt %, then a drop in the color conversion efficiency will occur due to effects such as concentration quenching.

In the present invention, there are no particular limitations on the line width, pitch and so on of the color-converting filter layers. These things may be selected as appropriate in accordance with the purpose of the organic EL device. Moreover, the thickness of the color-converting filter layers can also be selected as appropriate, but can be made to be, for example, about 10 μm.

(2) Matrix Resin

Next, a description will be given of the matrix resin used in the color-converting filter layers in the present invention. The matrix resin comprises a light-curable or joint-light/heat-curable resin. This resin is subjected to light and/or heat treatment, thus generating radical species or ionic species and hence polymerizing or crosslinking the resin, thus making the resin insoluble and unmeltable, whereby the color-converting filter layers are formed.

Light-curable or joint light/heat-curable resins include, for example, (1) acrylic polyfunctional monomers or oligomers having a plurality of acryloyl groups or methacryloyl groups, (2) polyvinyl cinnamic acid esters, (3) chain or cyclic olefins, and (4) monomers having epoxy groups. Moreover, it is preferable for the light-curable or joint-light/heat-curable resin to be soluble in organic solvents or alkaline solutions in the state in which the resin has not been cured to form the color-converting filter layers.

The above curable resins are used, for example, in the form of a composition by applying the composition onto the substrate, and then patterning. For example, a curable resin of type (1) is mixed with water or a thermopolymerization initiator, the composition is applied, and then light or heat treatment is performed, thus generating photo-radicals or thermal radicals and hence producing polymerization. Moreover, a curable resin of type (2) is mixed with a sensitizer, the composition is applied, and then light or heat treatment is performed, thus producing dimerization and crosslinking. A curable resin of type (3) is mixed with a bisazide, the composition is applied, and then light or heat treatment is performed, thus generating a nitrene, and hence crosslinking the olefin. A curable resin of type (4) is mixed with a photoacid generator, the composition is applied, and then light or heat treatment is performed, thus generating an acid (cations) and carrying out polymerization. In the present invention, a composition of a light-curable or joint light/heat-curable resin of type (1) above is preferable, since high-detail patterning is possible, and the reliability in terms of solvent resistance, thermal resistance and so on is good.

(3) Black Matrix

There are no particular limitations on the black matrix, so long as it absorbs visible light well, and does not have an adverse effect on the light-emitting part or the color-converting filter layers. In the present invention, it is preferable to form the black matrix from, for example, a black inorganic layer, or a layer comprising a resin having a black dye or a black pigment dispersed therein. For example, examples of black inorganic layers are chrome films (chromium oxide/chromium multilayer films) and so on. Moreover, examples of layers comprising a resin having a black dye or a black pigment dispersed therein are ones comprising a resin such as a polyimide having a pigment or dye such as carbon black, a phthalocyanine or a quinacridone dispersed therein, color resists, and so on. Such a black matrix can be formed using a dry process such as sputtering, CVD or vacuum deposition, or a wet process such as spin coating, and patterning can be carried out using photolithography or the like.

In the present invention, the optical reflectivity of the black matrix is not more than about 40%, preferably not more than about 30%, more preferably not more than about 10%. If the reflectivity is higher than this, then incident light from the outside will be reflected, resulting in a drop in contrast. In the present invention, a chrome film (a few tens of %) and a pigment-containing resin layer (10% or less) have a favorable optical reflectivity, but a pigment-containing resin layer is more preferable than a chrome film due to having a lower optical reflectivity. However, with an inorganic layer, depending on the material it may be possible to make the black matrix be electrically conductive and thus function as an auxiliary electrode for the transparent electrode. The material of the black matrix thus should be selected as appropriate in accordance with the usage of the color-converting filter substrate.

The black matrix preferably has a thickness of about 0.5 to 2.0 μm.

(4) Overcoat Layer 636

The overcoat layer which can be used in the present invention has a function of hermetically sealing the various elements of the color-converting filter substrate, and thus protecting the color-converting filter layers, the black matrix and so on from harmful gases, moisture and so on from the outside. With the color-converting filter substrate of the present invention, the overcoat layer is an optional element, but since the overcoat layer exhibits the above function, it is preferable to provide the overcoat layer. There are no particular limitations on the material of the overcoat layer, so long as this material does not have an adverse effect on the color-converting filter layers. Moreover, in the case of using the color-converting filter substrate in a device such as a light-emitting device as in the present embodiment, the overcoat layer must not have an adverse effect on the lower electrodes, the organic EL layer, the upper electrode(s), the passivation layer and so on.

Preferably the overcoat layer is flat.

In the present invention, the overcoat layer is, for example, a layer that has high transparency in the visible region (a transmissivity of at least about 50% in a range of 400 to 800 nm), Tg of at least about 100° C., and a surface hardness of at least pencil hardness 2 H. The material used in the overcoat layer in the present invention preferably is a material for which a coating film can be formed on the substrate such that the surface of the coating film is flat, and that does not cause deterioration in the functions of the color-converting filter layers. Examples are imide-modified silicone resins (Japanese Patent Application Laid-open Nos. 5-134112, 7-218717, and 7-306311), materials obtained by dispersing an inorganic metal compound ($TiO_2$, $Al_2O_3$, $SiO_2$, etc.) in an acrylic resin, a polyimide resin, a silicone resin or the like (Japanese Patent Application Laid-open Nos. 5-119306 and 7-104114), epoxy-modified acrylate resins, which are UV-curable resins (Japanese Patent Application Laid-open No. 7-48424), acrylate monomer/oligomer/polymer resins having reactive vinyl groups, resist resins (Japanese Patent Application Laid-open Nos. 6-300910, 7-128519, 8-279394, and 9-330793), inorganic compounds formed through a sol-gel method (Gekkan Soshi, 1997, Vol. 3, No. 7, Japanese Patent Application Laid-open No. 8-279394), and light-curable resins and/or heat-curable resins such as fluororesins (Japanese Patent Application Laid-open Nos. 5-36475 and 9-330793).

In the present invention, in situations where the light-emitting part is susceptible to moisture, alkalis or the like, it is necessary to make the overcoat layer have a function of protecting the light-emitting part from these. For the overcoat layer, it is possible to use a material that is electrically insulating, acts as a barrier against gas, moisture, alkalis, organic solvents and so on, has high transparency in the visible region (a transmissivity of at least about 50% in a range of 400 to 800 nm), and has a film hardness sufficient to withstand the formation of the electrodes, preferably at least 2 H. For example, an inorganic oxide, an inorganic nitride or the like can be used, for example $SiO_x$, $SiN_x$, $SiN_xO_y$, $AlO_x$, $TiO_x$, $TaO_x$, or $ZnO_x$. Note that with such a material, a layer can be formed without the flatness of the surface of the overcoat layer of the present invention being impaired.

The overcoat layer may be a single layer, or may comprise a plurality of layers formed on top of one another. Moreover, in the case of comprising a plurality of layers, the various layers may be of the same material or different materials, but to improve the barrier ability, it is preferable to use different materials.

Conditions such as the thickness of the overcoat layer can be selected as appropriate by a person skilled in the art, giving consideration to the effects on the display performance, in particular the viewing angle characteristics. For example, the thickness and so on can be determined in accordance with a document in which the relationship between the thickness of the overcoat layer and the minimum pixel width of the organic EL device is disclosed (Japanese Journal of Technical Disclosure 2001-6083). In the present invention, the thickness of the overcoat layer is, for example, about 3 to 20 µm, preferably about 5 to 15 µm.

Note that it is possible to make the overcoat layer have both a function of hermetically sealing the various elements of the color-converting filter substrate and thus protecting the color-converting filter layers, the black matrix and so on from harmful gases, moisture and so on from the outside (a protecting function) and a flattening function. It is also possible to make separate layers have the flattening function and the protecting function. For example, a flattening layer having the flattening function and a passivation layer having the protecting function may be separately provided.

(5) Substrate

For the substrate, an insulating substrate made of glass, plastic or the like, or a substrate obtained by forming a thin insulating film on a semi-conductive or conductive substrate, can be used. Alternatively, a flexible film made from a polyolefin, an acrylic resin, a polyester resin, a polyimide resin or the like may be used as the substrate. In the present invention, in the case of a top emission type organic EL device, supporting substrate 102 may be constituted from at least a substrate and a reflective film as described earlier. In this case, a material as described above can be used as is for the substrate. In addition, instead of a supporting substrate, a substrate made of a metal or an alloy that reflects light can be used, in which case an insulating layer is provided on the substrate, whereby the substrate and the reflective film can be combined. As the material of the insulating layer, an inorganic oxide, an inorganic nitride, an organic material or the like can be used as described earlier for the passivation layer and the flattening layer. Parameters such as the thicknesses of the various layers are those conventionally used, and can be selected as appropriate by a person skilled in the art.

Next, a description will be given of a method of manufacturing an organic EL device of the present invention.

The method of manufacturing an organic EL device of the present invention comprises (1) a step of providing a supporting substrate, (2) a step of forming lower electrodes on the supporting substrate, (3) a step of forming an organic EL layer on the lower electrodes, and (4) a step of forming upper electrode(s) on the organic EL layer. Following is a description of the respective steps. First, the method in the case of manufacturing a passive type organic EL device (e.g., as shown in FIG. 3) will be described, and then the method in the case of manufacturing a TFT type organic EL device (e.g., as shown in FIG. 4) will be described. In the following description, while using reference numerals as appropriate, a description will be given for the case in which the lower electrodes are anodes. However, the present invention is not limited thereto. An embodiment in which the lower electrodes are cathodes is also included, and in this case a person skilled in the art can again select the materials of the lower electrodes, the organic EL layer and the upper electrode(s), and the film formation method as appropriate.

Step (1) is a step of providing a supporting substrate. A supporting substrate as described in the section on the organic EL device above can be used.

It is preferable to subject the supporting substrate to surface treatment such as flattening treatment in advance.

In the case of the organic EL device of the present invention, the following steps (2) to (4) should be carried out using the above-mentioned supporting substrate.

Note that with a passive type organic EL device, it is preferable to provide a reflective film on the supporting substrate. In this case, the supporting substrate is as described before, and may be either transparent or opaque. The reflective film can be formed on the supporting substrate using a commonly-used method such as sputtering, CVD, vacuum deposition, a dipping method, or a sol-gel method. Moreover, an insulating layer can be formed on the reflective film if required. The insulating layer can be formed using a commonly-used method such as sputtering, CVD, vacuum deposition, a dipping method, or a sol-gel method. The material of the insulating layer is as described earlier in the section on the reflective film. An inorganic nitride, an organic material or the like can be used as described for the passivation layer and the overcoat layer.

Step (2) is a step of forming lower electrodes on the supporting substrate. The lower electrode layer is deposited by sputtering or the like on the supporting substrate on which the reflective film has been formed. In the case that the organic EL device is to be used as a display or the like, a lower electrode layer is deposited over the whole surface, a resist material is applied, and then patterning is performed using a photolithography method or the like, to form a striped pattern of lower electrodes (anodes) 104 in positions corresponding to the light-emitting parts of the various colors. For example, in the case of using IZO for the lower electrodes, a photoresist material (e.g., OFPR-800 (made by Tokyo Ohka Kogyo Co., Ltd.) is applied onto the IZO by spin coating, prebaking is carried out for about 60 to 240 seconds at about 50 to 150° C. using a clean oven or a hot plate. The substrate with the prebaked photoresist is exposed with light and then developed, to form the lower electrode pattern. Next, the IZO is etched with a weakly acidic solution of oxalic acid or the like, to form the lower electrodes. An insulating film can be formed if needed. The insulating film can be formed using a suitable method known to persons skilled in the art, such as the lift-off resist method.

Barrier walls of upper electrodes are formed next. A negative type photopolymer such as ZPN-1100 made by Zeon Corporation is applied, an exposure is performed with an amount of light which does not expose the whole of the negative type photopolymer using a photomask having a prescribed pattern width, another exposure is performed with an amount of light which exposes the whole of the negative type photopolymer using a photomask having a prescribed pattern width which is narrower than the pattern width, and development is performed. The process forms barrier walls which isolate from the upper electrode.

Step (3) is a step of forming an organic EL layer on the supporting substrate on which the lower electrodes have been formed. Organic EL layer 106 is formed on the supporting substrate on which the lower electrodes have been formed. As the organic EL layer, for example a hole injection layer, a hole transport layer, an organic light-emitting layer, an electron transport layer and an electron injection layer are deposited sequentially using a resistive heating vapor deposition apparatus or the like, without releasing the vacuum. Note that organic EL layer 106 is not limited to having this constitution, but rather may take any of various forms as described earlier. For any of the forms, the various layers may be deposited using a resistive heating vapor deposition apparatus or the like.

Step (4) is a step of forming upper electrodes on the organic EL layer.

When the organic EL device is to be used as a display or the like, continuing on from step (3) described above, it is preferable to from upper electrodes (cathodes) 108 without releasing the vacuum, using a mask so as to obtain a pattern of lines perpendicular to the lines of the lower electrodes.

As described earlier, the upper electrodes of the organic EL device of the present invention are formed from a plurality of transparent electrode layers. The transparent electrode layers are formed so as to satisfy conditions (A) and (B) described earlier. In particular, in the present invention, the transparent electrode layers are formed while varying the refractive index such that various properties such as the electrical resistance and the transmissivity are not impaired. Sputtering, ion plating, vapor deposition or the like can be used in the formation of the upper electrodes. In the present invention, it is preferable to use DC sputtering. In the present step, the control of the refractive index for each of the transparent electrode layers is carried out, for example, by changing the deposition power, or changing the oxygen concentration in the atmosphere during the film formation. Moreover, in the case of RF ion plating in which a plasma is produced at high frequency, the control of the refractive index for each of the transparent electrode layers is carried out by changing the applied RF voltage, or changing the introduced oxygen gas concentration. The refractive index increases as the applied voltage is increased, and the refractive index also increases as the oxygen concentration is increased.

Figure 7A:
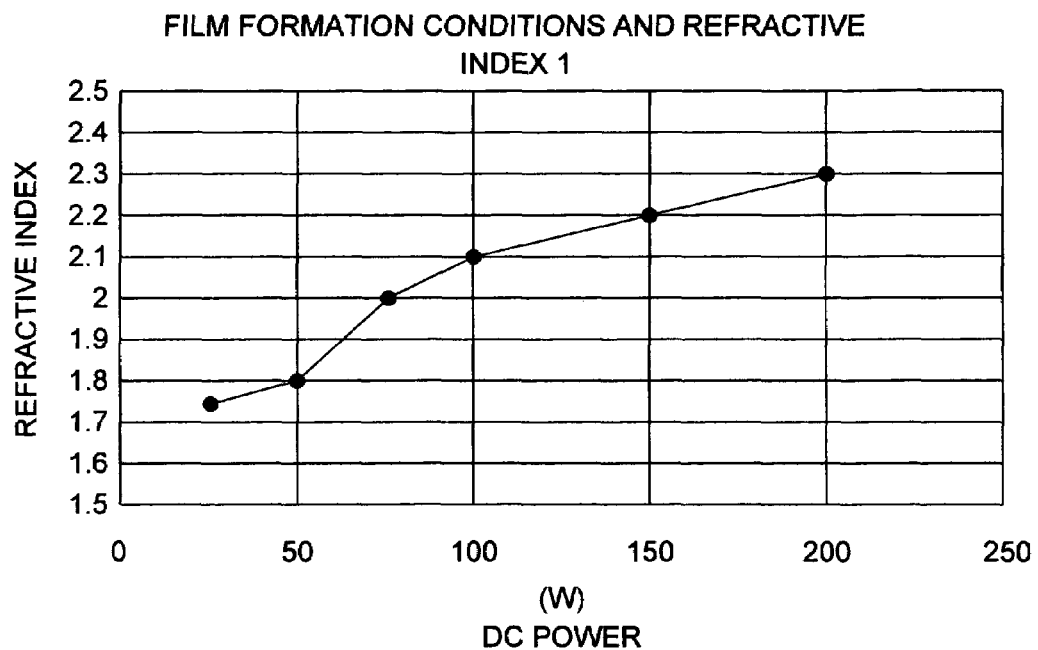
FIG. 7(a) is a graph showing the relationship between the DC power and the refractive index in the case of depositing IZO.

For DC sputtering, the result of changing the power during the film formation to control the refractive index is shown in FIG. 7(a). IZO was used as the target, Ar gas was used as the deposition gas, and the DC power of the DC sputtering was changed. As shown in FIG. 7(a), the refractive index increases as the DC power is increased.

Figure 7B:
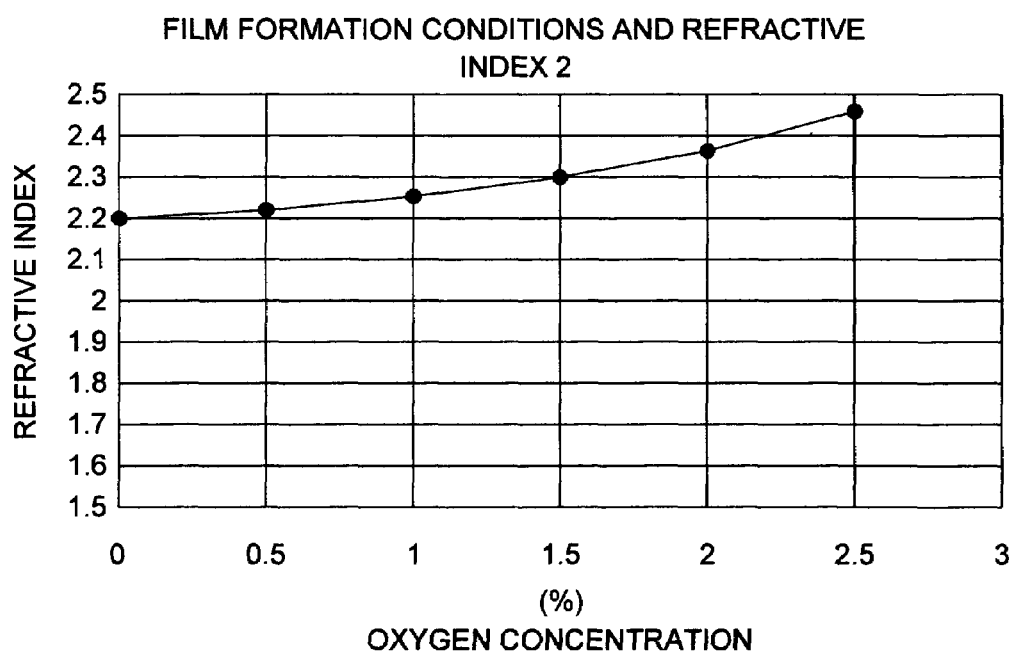
FIG. 7(b) is a graph showing the relationship between the oxygen concentration and the refractive index in the case of depositing IZO.

The result of changing the oxygen concentration in the atmosphere during the film formation to control the refractive index is shown in FIG. 7(b). The DC power of the DC sputtering was fixed at 150 W, IZO was used as the target, and Ar plus oxygen was used as the deposition gas, with the oxygen concentration being changed. As shown in FIG. 7(b), the refractive index increases as the oxygen concentration is increased.

Transparent electrode layers having the desired refractive indices may be formed based on the above results.

If required, a passivation layer is formed on the upper electrode side of the organic EL device. There are no particular limitations on the method of forming the passivation layer. In the case of using an inorganic material, the passivation layer can be formed with a conventional method such as sputtering, CVD, vacuum deposition, a dipping method, or a sol-gel method. Moreover, in the case of using a polymer material, there are no particular limitations on the method of forming the passivation layer. For example, a conventional method such as a dry method (sputtering, vapor deposition, CVD, etc.) or a wet method (spin coating, roll coating, casting, etc.) can be used.

The organic EL device obtained as described above is sealed using sealing glass and an outer periphery sealing layer made of a UV-curing adhesive or the like under a dry nitrogen atmosphere in a glove box. If necessary, a filler is injected, to form a filler layer. When a filler is to be injected, a hole should be provided in part of the outer periphery sealing layer. After the outer periphery sealing layer has been cured, the filler is injected through this hole, and then the hole is blocked.

The sealing substrate, the outer periphery sealing layer and the filler layer may be formed integrally as a single body by, for example, uniformly applying a resin such as a UV-curing resin or a joint light/heat-curable resin onto the supporting filter substrate on which the light-emitting part has been provided, and then curing this resin.

Through the above, an organic EL device can be manufactured.

The method of manufacturing an organic EL device of the present invention also includes a method of manufacturing a TFT type organic EL device (second embodiment).

In this method of manufacturing an organic EL device, in step (1), TFTs and a flattening layer are formed on the supporting substrate. The TFTs and the flattening layer can be formed using means known in the art. That is, a plurality of TFTs 404 and flattening layer 406 may be formed on supporting substrate 402 through a suitable combination of a coating method such as sputtering, vapor deposition, spin coating or the like, and photolithography and so on. After that, in step (2), the lower electrodes are formed through a suitable combination of a coating method such as sputtering, vapor deposition, spin coating or the like, and photolithography and so on. After that, an organic EL layer and an upper electrode are formed as in steps (3) and (4) described earlier. As described earlier for the passive type, in step (4), an upper electrode comprising a plurality of transparent electrode layers satisfying prescribed conditions is formed.

Through the above, a TFT type organic EL device can be manufactured.

Next, a method of manufacturing a color organic EL device of the present invention will be described.

The method of manufacturing a color organic EL device of the present invention includes methods of manufacturing top emission passive type and top emission TFT type color organic EL devices (e.g., those shown respectively in FIGS. 5 and 6). The manufacturing method of the present invention is a method of manufacturing a color organic EL device containing an organic EL device in which the upper electrode(s) has/have special features as described earlier.

The method of manufacturing a color organic EL device of the present invention further includes, after step (4), a step of forming a color-converting filter substrate comprising at least color-converting filter layers. Specifically, the method includes, after step (4) described earlier, a step of providing a color-converting filter substrate on the upper electrode side of the organic EL device.

For example, in the present invention, a method can be adopted in which a color-converting filter substrate is separately manufactured as described in (I) to (III) below, and then this color-converting filter substrate is bonded onto an organic EL device manufactured through steps (1) to (4) described earlier.

Specifically, a passive type or TFT type organic EL device formed as described earlier and the color-converting filter substrate are placed in a dry nitrogen atmosphere, in which both the oxygen and moisture concentration preferably are not more than 1 ppm. A UV-curing adhesive then is applied onto outer peripheral parts using a dispenser robot. After that, the organic EL device and the color-converting filter substrate are adhered to each other. Alignment is performed between the light-emitting part of the organic EL device and the color-converting filter layers. In the case of active matrix driving, the lower electrodes are aligned with the color-converting filter layers. In the case of passive matrix driving, the parts where the line patterns of the lower electrodes and the upper electrodes intersect one another are aligned with the color-converting filter layers.

After that, the above-mentioned UV-curing adhesive is irradiated with ultraviolet radiation, to cure the adhesive and form an outer periphery sealing layer. It is preferable to irradiate with ultraviolet radiation for about 30 seconds at an intensity of about 100 mW/cm$^2$.

Through the above, a color organic EL device can be formed.

Following is a description of the manufacturing process for the color-converting filter substrate. The manufacturing process comprises steps (I) to (III) as follows.

(I) Step of Forming Black Matrix Having Openings Corresponding to Regions of Red, Green and Blue Color-converting Filter Layers on the Substrate.

In the present invention, a black matrix material as described earlier is applied over the whole surface of the supporting substrate by spin coating, spraying or dipping. The coated substrate is dried by heating, and then patterned by photolithography. Specifically, a resist is applied by spin coating, spraying or dipping onto the black matrix that has been applied over the whole surface of the substrate and dried, and exposure (UV irradiation or the like) is carried out via a mask having openings formed therein corresponding to regions of red, green and blue color-converting filter layers, to pattern the resist. Next, the black matrix and the resist at the parts corresponding to the openings for the various colors are removed by developing, to form a black matrix having the desired pattern. Note that as the black matrix, it is preferable to use one having an optical transmissivity of not more than about 10%.

(II) Step of Forming Red, Green and Blue Color-converting Filter Layers in Order in Openings of Black Matrix.

In the present invention, the color-converting filter layers are formed by applying a matrix resin containing dye(s) or pigment(s) by spin coating or the like onto the transparent substrate, which is, for example, a glass made by Corning (e.g., Corning 1737 glass, which is an alkali-free glass). Patterning is carried out using photolithography or the like. For example, a matrix resin containing a fluorescent colorant that emits red fluorescence is applied by spin coating or the like over the whole surface of the substrate on which the black matrix has been formed. The matrix resin is dried by heating, and then patterned with photolithography. This procedure is then carried out for the color-converting filter layers of the other colors, to form the color-converting filter layers of the various colors.

Following is a specific description of the method of forming the filter layers of each of the colors, but the present invention is not limited thereto. Note that in the following description, a method of forming the various filter layers in the case of using an organic EL layer that emits blue/green light is taken as an example.

Formation of blue filter layers. A blue filter layer material is applied by spin coating method onto the transparent supporting substrate, and then photolithography or the like is used to pattern the layer and produce a pattern of blue filter layers. Specifically, the blue filter layer material is applied and then dried, and then a resist is applied by spin coating, spraying or dipping. Exposure (UV irradiation or the like) is carried out through a mask so that the regions of the blue filter layers will be formed, thus carrying out patterning. Next, the matrix resin and the resist at the parts corresponding to the openings are removed by developing, to form the blue filter layers in the desired pattern.

Formation of green color-converting filter layers. Green color-converting fluorescent colorant(s) is/are dissolved in a solvent, and a photopolymerizable resin is added, to obtain a curable resin composition solution. This solution is applied by spin coating or the like onto the transparent supporting substrate on which the line pattern of the blue filter layers has already been formed, and patterning is carried out using a photolithography method or the like, to produce a line pattern of green color-converting filter layers. Specifically, the green color-converting filter layer material is applied and then dried, and then a resist is applied by spin coating, spraying or dipping. Exposure (UV irradiation or the like) is carried out through a mask so that the regions of the green color-converting filter layers are formed, thus carrying out patterning. Next, the matrix resin and the resist at the parts corresponding to the openings are removed by developing, to form the green color-converting filter layers in the desired pattern.

Formation of red color-converting filter layers. Red color-converting fluorescent colorant(s) is/are dissolved in a solvent, and a photopolymerizable resin is added, to obtain a curable resin composition solution. This solution is applied by spin coating method or the like onto the transparent supporting substrate on which the line patterns of the blue filter layers and the green color-converting filter layers have been formed. Patterning is carried out using a photolithography method or the like, to produce a line pattern of red color-converting filter layers. Specifically, the red color-converting filter layer material is applied and then dried, and then a resist is applied by spin coating, spraying or dipping. Exposure (UV irradiation or the like) is carried out through a mask so that the regions of the red color-converting filter layers are formed, thus carrying out patterning. Next, the matrix resin and the resist at the parts corresponding to the openings are removed by developing, to form the red color-converting filter layers in the desired pattern.

Note that in the formation of each of the above sets of filter layers, the drying is carried out at about 60 to 100° C., preferably at about 80° C. The conditions used can be conventionally known conditions, or can easily be derived from such conditions by a person skilled in the art. For example, for the blue filter layers the prebaking after the spin coating may be carried out for about 15 minutes at a temperature of about 80° C., and the drying after the exposure and developing may be carried out, for example, for about 30 minutes at a temperature of about 200° C. For the green color-converting filter layers, for example, the prebaking after the spin coating may be carried out for about 15 minutes at a temperature of about 80° C., and the drying after the exposure and developing may be carried out for about 30 minutes at a temperature of about 180° C. For the red color-converting filter layers, for example, the prebaking after the spin coating may be carried out for about 10 minutes at a temperature of about 80° C., and the drying after the exposure and developing may be carried out for about 30 minutes at a temperature of about 180° C.

In the present invention, the various color-converting filter layers are preferably in the same regions as the openings in the black matrix, but may occupy regions larger than the openings in the black matrix.

Color filter layers optionally may be provided between the color-converting layers and the substrate. That is, in the case that sufficient color purity cannot be obtained with only the green and red color-converting filter layers described above, color filter layers may be provided. The thickness of the color filter layers is preferably about 1 to 1.5 µm. The color filter layers can be formed using a similar method to the blue filter layers described above.

Through the above, the color-converting filter layers of the present invention can be obtained.

(III) Step of Forming Overcoat Layer.

The step of forming an overcoat layer in the present invention can be carried out by applying a material for forming the overcoat layer onto the color-converting filter substrate described above by spin coating or the like, and baking (at, for example, about 100 to 180° C., preferably about 130° C.) using heating means such as an oven. In the present invention, heating conditions of about 30 minutes at about 180° C. are suitable.

Note that the material used in the formation of the overcoat layer is as described earlier.

Through the above, the color-converting filter substrate can be manufactured.

In the procedure described above, the color-converting filter substrate was bonded onto the organic EL device, but in the present invention, the color-converting filter substrate provided on the upper electrode(s) may instead be provided by forming on the color-converting filter layers in order after providing the upper electrode(s).

In this case, a passivation layer should be further formed after forming the upper electrode(s), and then the blue filter layers, the green color-converting filter layers and the red color-converting filter layers should be formed on the passivation layer using a combination of spin coating and photolithography. The formation of the passivation layer and the color-converting filter layers is as described earlier. After the color-converting filter layers have been formed, a passivation layer for securing gas-tightness may be formed over the whole of the substrate if required. Next, sealing is carried out by forming an outer periphery sealing layer and a sealing substrate. A filler layer may be formed if required. The procedure for forming these is as described earlier. The outer periphery sealing layer, the sealing substrate and the filler layer may be formed integrally as a single body by, for example, uniformly applying a resin such as a UV-curing resin or a joint light/heat-curable resin onto the color-converting filter substrate on which the light-emitting part has been provided, and then curing this resin.

EXAMPLE 1

CrB (a reflective film) was formed to a thickness of 100 nm by DC sputtering on a glass substrate. Ar was used as the sputtering gas, and a power of 300 W was applied. IZO was then formed to a thickness of 100 nm as a lower electrode by DC sputtering with a power of 250 W using Ar as the sputtering gas. After that, in an organic vapor deposition apparatus, α-NPD was formed to a thickness of 40 nm as a hole injection layer, an aluminum chelate (Alq3) was formed to a thickness of 60 nm as an organic light-emitting layer, and Li was formed to a thickness of 1 nm as an electron injection layer. Next, IZO was deposited by DC sputtering to form the transparent electrode layers of the upper electrode as shown in Table 1. Regarding the IZO deposition conditions, Ar was used as the sputtering gas, and IZO was used as the target. For the first and third transparent electrode layers, the deposition was carried out with a DC power of 150 W, and for the second and fourth transparent electrode layers, the deposition was carried out with a DC power of 50 W. Through the procedure described above, an organic EL device was obtained.

TABLE 1

|  | Refractive index | Thickness (nm) |
| --- | --- | --- |
| 1st transparent electrode layer | 2.2 | 75 |
| 2nd transparent electrode layer | 1.8 | 62.5 |
| 3rd transparent electrode layer | 2.2 | 102 |
| 4th transparent electrode layer | 1.8 | 77 |

EXAMPLE 2

A reflective film, a lower electrode, and an organic EL layer, comprising a hole injection layer, an organic light-emitting layer and an electron injection layer, were formed on a glass substrate as in Example 1. IZO was then deposited by DC sputtering to form the transparent electrode layers of the upper electrode as shown in Table 2. Regarding the IZO deposition conditions, Ar was used as the sputtering gas, and IZO was used as the target. For the first, third and fifth transparent electrode layers, the deposition was carried out with a DC power of 150 W, and for the second, fourth and sixth transparent electrode layers, the deposition was carried out with a DC power of 50 W. Through the procedure described above, an organic EL device was obtained.

TABLE 2

|  | Refractive index | Thickness (nm) |
| --- | --- | --- |
| 1st transparent electrode layer | 2.2 | 75 |
| 2nd transparent electrode layer | 1.8 | 62.5 |
| 3rd transparent electrode layer | 2.2 | 102 |
| 4th transparent electrode layer | 1.8 | 69 |
| 5th transparent electrode layer | 2.2 | 113 |
| 6th transparent electrode layer | 1.8 | 77 |

EXAMPLE 3

An organic EL device was manufactured using the same procedure as in Example 1, except that when depositing the transparent electrode layers of the upper electrode, a DC power of 50 W was used, and the odd numbered layers were formed using Ar plus oxygen (Ar:$O_2$=97.8:2.2) as the sputtering gas, while the even numbered layers were formed using Ar as the sputtering gas.

EXAMPLE 4

An organic EL device was manufactured using the same procedure as in Example 2, except that when depositing the transparent electrode layers of the upper electrode, a DC power of 50 W was used, and the odd numbered layers were formed using Ar plus oxygen (Ar:$O_2$=97.8:2.2) as the sputtering gas, while the even numbered layers were formed using Ar as the sputtering gas.

COMPARATIVE EXAMPLE 1

An organic EL device was manufactured as in Example 1, except that IZO of refractive index 2.2 was formed to a thickness of 75 nm as the upper electrode by DC sputtering with a DC power of 150 W using Ar as the sputtering gas and IZO as the sputtering target.

Evaluation.

The organic EL devices were evaluated as follows.

The organic EL device of each of the examples and comparative example described above was lit to a brightness of 100 cd/m$^2$, the current at this time was measured, and evaluation was carried out by calculating the current efficiency. The results are shown in Table 3. All of the examples exhibited a higher light emission efficiency than the comparative example.

TABLE 3

|  | Current efficiency (cd/A) |
| --- | --- |
| Example 1 | 7.98 |
| Example 2 | 8.2 |
| Example 3 | 7.8 |
| Example 4 | 8.2 |
| Comparative Example 1 | 6.8 |

Figure 8:
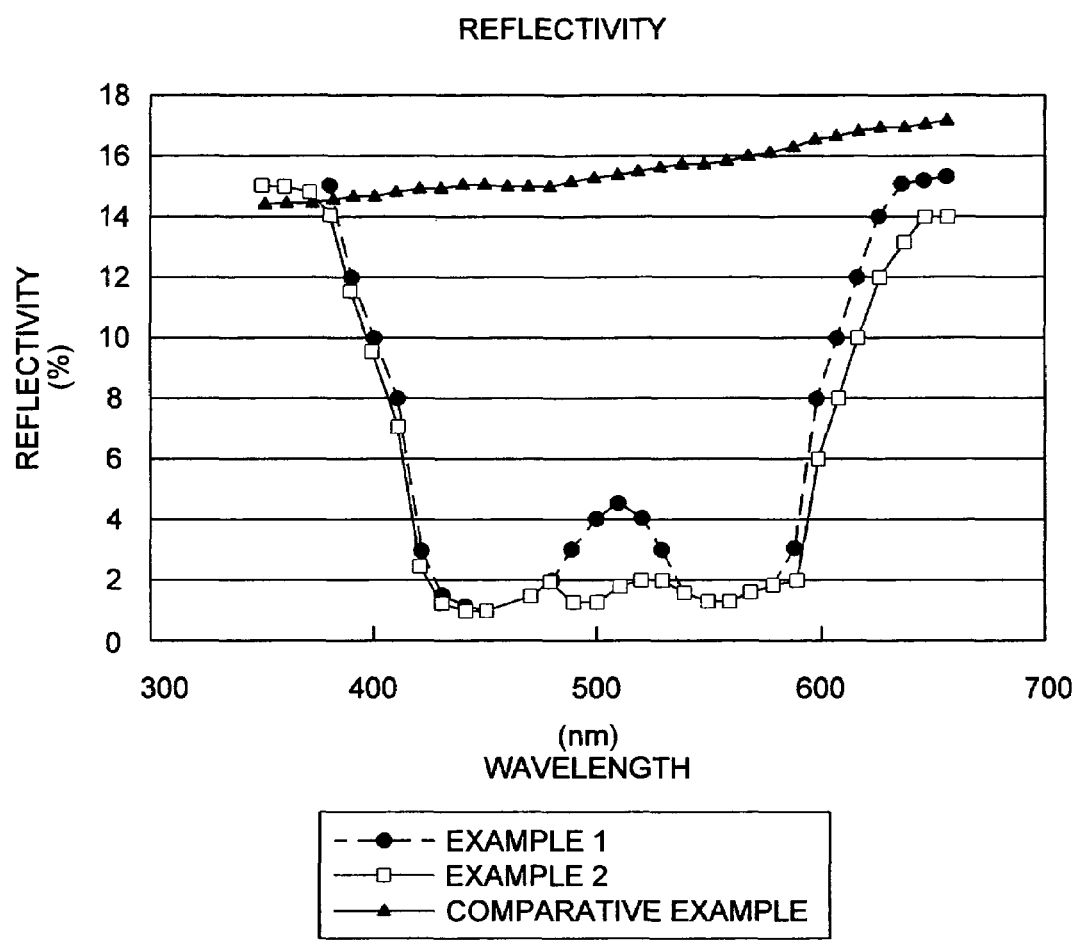
FIG. 8 is a graph showing the reflectivity of the transparent upper electrode for Examples 1 and 2 and Comparative Example 1 versus the wavelength of the incident light.

FIG. 8 is a graph showing the reflectivity of the upper electrode for Example 1, Example 2 and the Comparative Example 1 versus the wavelength of the extracted light. As is clear from FIG. 8, by using an upper electrode according to the present invention, the reflectivity can be reduced over any chosen wavelength region.

EXAMPLES 5 AND 6

TFTs, anodes and an organic EL layer were formed with patterning onto a glass substrate using a method known from hitherto. Next, IZO was deposited on to form transparent electrode layers constituting a cathode using the same method as in Example 1 or 2. After that, passivation layer 6 was formed following a conventional procedure so as to cover the various formed layers. A color-converting filter substrate as described below was bonded onto the TFT type organic EL device thus obtained, thus manufacturing a color organic EL device. The anodes were arranged at a pitch of 195 μm in the direction of the long sides and a pitch of 65 μm in the direction of the short sides. The dimension of the area over which the cathode faced each anode was 180 μm in the direction of the long sides and 50 μm in the direction of the short sides.

Manufacture of color-converting filter substrate. Blue filter layers, green color-converting filter layers, red color-converting filter layers and a flattening layer were formed on a transparent substrate following the procedure described below, thus forming a color-converting filter substrate. Each of the color filter layers and fluorescent color-converting layers had dimensions of 48×178 μm.

Formation of blue filter layers. A blue filter material (made by Fujifilm Arch Co., Ltd., Color Mosaic CB-7001) was applied using a spin coating method onto a sheet of Corning glass (50×50×1.1 mm) as a transparent substrate, and patterning was carried out with photolithography, to produce blue filter layers.

Formation of green color-converting filter layers. An amount of 0.7 parts by weight of a coumarin as a fluorescent colorant was dissolved in 120 parts by weight of a propylene glycol monoethyl acetate (PGMEA) solvent. 100 parts by weight of a photopolymerizable resin V259PA/P5 (trade name, Nippon Steel Chemical Co., Ltd.) was then added to the solution and dissolved, thus obtaining a coating liquid. The coating liquid was applied by spin coating the transparent substrate on which the line pattern of the blue filter layers had been formed, and then patterning was carried out with photolithography, to produce green color-converting filter layers.

Formation of red color-converting filter layers. An amount of 0.6 parts by weight of a coumarin, 0.3 parts by weight of Rhodamine 6G and 0.3 parts by weight of Basic Violet 11 as fluorescent colorants were dissolved in 120 parts by weight of a propylene glycol monoethyl acetate (PGMEA) solvent. An amount of 100 parts by weight of a photopolymerizable resin V259PA/P5 (trade name, Nippon Steel Chemical Co., Ltd.) was then added to the solution and dissolved, to obtain a,coating liquid. The coating liquid was applied by spin coating the transparent substrate on which the line patterns of the blue filter layers and the green color-converting filter layers had been formed, and then patterning was carried out with photolithography, to produce red color-converting filter layers.

Formation of Flattening Layer.

(i) Formation of Polymer Film

A UV-curing resin (epoxy-modified acrylate) was applied by spin coating onto the color-converting filter layers formed as described above, and irradiation was carried out with a high-pressure mercury lamp, to form a polymer film of thickness 8 μm. The patterns of the color-converting filter layers had not become deformed after the formation of the polymer film. Moreover, the upper surface of the polymer film was flat.

(ii) Formation of Inorganic Film Layer

An $SiO_x$ film of thickness 300 nm was formed on the polymer film as an inorganic film layer using a DC sputtering method at room temperature. Si was used as the sputtering target, and a mixed gas of Ar and oxygen ($Ar:O_2=5:1$) was used as the sputtering gas.

Bonding step. The supporting substrate on which the upper electrode and the passivation layer had been formed, and the color-converting filter substrate were bonded and sealed using a UV-curing adhesive under a dry nitrogen atmosphere (oxygen and moisture concentration both not more than 10 ppm) in a glove box.

The color organic EL devices of Examples 5 and 6 exhibited high light emission efficiency as with Examples 1 to 4 described earlier.

EXAMPLES 7 AND 8

CrB (a reflective film) was formed to a thickness of 100 nm by DC sputtering on a glass substrate. Ar was used as the sputtering gas, and a power of 300 W was applied. IZO was then formed to a thickness of 100 nm by DC sputtering with a power of 250 W using Ar as the sputtering gas, and patterning was carried out using a photolithography method, thus forming lower electrodes. After that, in an organic vapor deposition apparatus, α-NPD was formed to a thickness of 40 nm as a hole injection layer, an aluminum chelate (Alq3) was formed to a thickness of 60 nm as an organic light-emitting layer, and Li was formed to a thickness of 1 nm as an electron injection layer. Next, IZO was deposited by DC sputtering to form transparent electrode layers as shown in Table 1, and then patterning was carried out in a direction perpendicular to that for the lower electrodes, thus forming upper electrodes. The upper electrode deposition conditions were the same as in Example 1 or 2 described earlier. A color-coverting filter substrate as described in Examples 5 and 6 was then bonded on using the same procedure as in Examples 5 and 6, to manufacture a color organic EL device.

The color organic EL devices of Examples 7 and 8 exhibited high light emission efficiency as with the other examples described earlier.

According to the present invention, a top emission type organic EL device having excellent light emission efficiency can be obtained.

Moreover, according to the manufacturing method of the present invention, a top emission type organic EL device having excellent light emission efficiency can be provided.

What is claimed is:

1. An organic EL device comprising:
   a supporting substrate,
   a lower electrode,
   an organic EL layer, and
   an upper electrode,
   said lower electrodes, organic EL layer and upper electrode being formed sequentially on said supporting substrate,
   wherein said upper electrode is formed from a plurality of transparent electrode layers that have different refractive indices to one another, and
   wherein the plurality of transparent electrode layers constituting said upper electrode satisfy the conditions
   (A) $n_{i-1} > n_i > 1$ when i=2, and both $n_{i+1} > n_i > 1$ and $n_{i-1} > n_i > 1$ when i>2, and
   (B) (a) $n_i \times d_i = (2y+1) \times \lambda_i / 4$, and (b) $n_{i-1} \times d_{i-1} = (2z+1) \times \lambda_i / 2$,
   wherein i is an even number of at least 2, $n_i$ is the refractive index of the $i^{th}$ transparent electrode layer, $n_{i-1}$ is the refractive index of the $(i-1)^{th}$ transparent electrode layer, $n_{i+1}$ is the refractive index of the $(i+1)^{th}$ transparent electrode layer, $d_i$ is the thickness of the $i^{th}$ transparent electrode layer, $d_{i-1}$ is the thickness of the $(i-1)^{th}$ transparent electrode layer, y is an integer of at least 1, z is an integer of at least 1, and $\lambda_i$ is the wavelength of light for which the reflectivity is to be reduced for the $i^{th}$ transparent electrode layer.

2. The organic EL device according to claim 1, wherein thin film transistors are provided on said supporting substrate, and said lower electrodes are connected to said thin film transistors, and driven by said thin film transistors.

3. The organic EL device according to clam 1, wherein a color-converting filter substrate comprising at least a transparent substrate and color-converting filter layers is provided on the upper electrode side.

4. The organic EL device according to claim 1, wherein the material of each of the plurality of transparent electrode layers constituting said upper electrode is an In—Zn oxide or an In—Sn oxide.

5. The organic EL device according to claim 1, wherein a reflective film is provided on said supporting substrate.

6. The organic EL device according to claim 1, wherein said lower electrodes are reflective.

7. A method of manufacturing an organic EL device in which at least lower electrodes, an organic EL layer and an upper electrode are formed sequentially on a supporting substrate, comprising:
   (1) providing a supporting substrate;
   (2) forming lower electrodes on said supporting substrate;
   (3) forming an organic EL layer on said lower electrodes; and
   (4) forming an upper electrode on said organic EL layer;

wherein in (4), said upper electrode, which comprises a plurality of transparent electrode layers each having different refractive indices to one another, is formed by using a sputtering method, an ion plating method or a vapor deposition method, and one or both of the power and the oxygen concentration are adjusted during film formation, and wherein the plurality of transparent electrode layers constituting said upper electrode satisfy the conditions (A) $n_{i-1} > n_i > 1$ when $i=2$, and both $n_{i+1} > n_i > 1$ and $n_{i-1} > n_i > 1$ when $i > 2$, and (B) (a) $n_i \times d_i = (2y+1) \times \lambda_i / 4$, and (b) $n_{i-1} \times d_{i-1} = (2z+1) \times \lambda_i / 2$, wherein i is an even number of at least 2, $n_i$ is the refractive index of the $i^{th}$ transparent electrode layer, $n_{i-1}$ is the refractive index of the $(i-1)^{th}$ transparent electrode layer, $n_{i+1}$ is the refractive index of the $(i+1)^{th}$ transparent electrode layer, $d_i$ is the thickness of the $i^{th}$ transparent electrode layer, $d_{i-1}$ is the thickness of the $(i-1)^{th}$ transparent electrode layer, y is an integer of at least 1, z is an integer of at least 1, and $\lambda_i$ is the wavelength of light for which the reflectivity is to be reduced for the $i^{th}$ transparent electrode layer.

8. The method of manufacturing an organic EL device according to claim 7, additionally comprising first forming thin film transistors on said supporting substrate, and then forming a flattening layer on said substrate and said thin film transistors.

9. The method of manufacturing an organic EL device according to claim 7, additionally comprising forming a color-converting filter substrate comprising at least color-converting filter layers after said upper electrode is formed.

* * * * *